(12) United States Patent
Joshi et al.

(10) Patent No.: US 9,930,348 B2
(45) Date of Patent: Mar. 27, 2018

(54) COEFFICIENT LEVEL CODING IN A VIDEO CODING PROCESS

(71) Applicant: QUALCOMM Incorporated, San Diego, CA (US)

(72) Inventors: Rajan Laxman Joshi, San Diego, CA (US); Marta Karczewicz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 376 days.

(21) Appl. No.: 14/656,071

(22) Filed: Mar. 12, 2015

(65) Prior Publication Data

US 2015/0264362 A1    Sep. 17, 2015

Related U.S. Application Data

(60) Provisional application No. 61/953,659, filed on Mar. 14, 2014, provisional application No. 61/954,404, filed on Mar. 17, 2014.

(51) Int. Cl.
*H04N 19/18* (2014.01)
*H03M 7/40* (2006.01)
(Continued)

(52) U.S. Cl.
CPC ............. *H04N 19/18* (2014.11); *H03M 7/40* (2013.01); *H04N 19/00* (2013.01); *H04N 19/115* (2014.11); *H04N 19/13* (2014.11); *H04N 19/136* (2014.11); *H04N 19/157* (2014.11); *H04N 19/176* (2014.11); *H04N 19/70* (2014.11)

(58) Field of Classification Search
CPC ..................................................... H04N 19/18
See application file for complete search history.

(56) References Cited

U.S. PATENT DOCUMENTS

| 8,780,980 B2 * | 7/2014 | Yamaguchi | ............. | H03M 7/42 |
| | | | | 375/240.03 |
| 2006/0273937 A1 * | 12/2006 | Ishikawa | ................ | H03M 7/40 |
| | | | | 341/50 |

(Continued)

OTHER PUBLICATIONS

Third Written Opinion from International Application No. PCT/US2015/020462, dated Jun. 1, 2016, 6 pp.

(Continued)

*Primary Examiner* — James Pontius

(57) ABSTRACT

A device for coding video data includes a memory configured to store video data, and at least one processor configured to: determine a maximum number of bits to be used when coding a syntax element indicating absolute values of transform coefficients of a coding unit of the video data, determine a maximum number of suffix bits to be used when coding a Golomb-Rice/Exponential-Golomb coding suffix codeword of the syntax element, determine a maximum number of prefix bits to be used when coding a unary Golomb-Rice/Exponential-Golomb coding prefix codeword of the syntax element, determine the absolute values of transform coefficients for the coding unit, code a prefix codeword for one of the absolute values, and code a suffix codeword for the one of the absolute values, and code the coding unit based on the prefix codeword and the suffix codeword.

23 Claims, 5 Drawing Sheets

(51) Int. Cl.
| | |
|---|---|
| H04N 19/176 | (2014.01) |
| H04N 19/70 | (2014.01) |
| H04N 19/13 | (2014.01) |
| H04N 19/115 | (2014.01) |
| H04N 19/136 | (2014.01) |
| H04N 19/157 | (2014.01) |
| H04N 19/00 | (2014.01) |

(56) References Cited

U.S. PATENT DOCUMENTS

| | | | | |
|---|---|---|---|---|
| 2007/0171985 | A1* | 7/2007 | Kim | H04N 19/176 375/240.26 |
| 2009/0097768 | A1* | 4/2009 | Seregin | H04N 19/176 382/248 |
| 2010/0150242 | A1* | 6/2010 | Ozawa | H04N 19/176 375/240.16 |
| 2015/0139299 | A1* | 5/2015 | Seregin | H04N 19/91 375/240.02 |
| 2015/0319440 | A1* | 11/2015 | Tokumitsu | H04N 19/13 375/240.03 |

OTHER PUBLICATIONS

Response to Second Written Opinion dated Mar. 22, 2016, from International Application No. PCT/US2015/020462, filed May 20, 2016, 8 pp.

Response to Third Written Opinion dated Jun. 1, 2016, from International Application No. PCT/US2015/020462, filed Jul. 28, 2016, 10 pp.

International Search Report and Written Opinion from International Application No. PCT/US2015/020462, dated Jul. 31, 2015, 11 pp.

Second Written Opinion from International Application No. PCT/US2015/020462, dated Mar. 22, 2016, 5 pp.

Nguyen T., et al., "Reduced-Complexity Entropy Coding of Transform Coefficient Levels using Truncated Golomb-Rice Codes in Video Compression", 18th IEEE International Conference on Image Processing (ICIP), 2011, Sep. 11, 2011 (Sep. 11, 2011), pp. 753-756, XP032080600, DOI: 10.1109/ICIP.2011.6116664 ISBN:978-1-4577-1304-0.

"Exponential-Golomb coding", Wikipedia Foundation Inc., URL: https://en.wikipedia.org/w/index.php?title=Exponential-Golomb_coding&oldid=702406490; last modified on Jan. 30, 2016, 2 pp.

Wiegand et al., "WD1: Working Draft 1 of High-Efficiency Video Coding," JCTVC-C403, 3rd Meeting: Guangzhou, CN, Oct. 7-15, 2010, 137 pp.

Wiegand et al., "WD2: Working Draft 2 of High-Efficiency Video Coding," JCTVC-D503, 4th Meeting: Daegu, KR, Jan. 20-28, 2011, 153 pp.

Wiegand et al., "WD3: Working Draft 3 of High-Efficiency Video Coding," Document JCTVC-E603, 5th Meeting: Geneva, CH, Mar. 16-23, 2011, 193 pp.

Bross et al., "WD4: Working Draft 4 of High-Efficiency Video Coding," 6th Meeting: JCTVC-F803_d2, Torino, IT, Jul. 14-22, 2011, 226 pp.

Bross et al., "WD5: Working Draft 5 of High-Efficiency Video Coding," 7th Meeting: Geneva, CH, Nov. 21-30, 2011, JCTVC-G1103_d2, 214 pp.

Bross et al., "High efficiency video coding (HEVC) text specification draft 6," 8th Meeting: San Jose, CA, USA, Feb. 1-10, 2012, JCTVC-H1003, 259 pp.

Bross et al., "High efficiency video coding (HEVC) text specification draft 7," 9th Meeting: Geneva, CH, Apr. 27-May 7, 2012, JCTVC-I1003_d2, 290 pp.

Bross et al., "High efficiency video coding (HEVC) text specification draft 8," 10th Meeting: Stockholm, SE, Jul. 11-20, 2012, JCTVC-J1003_d7, 261 pp.

Bross et al., "High efficiency video coding (HEVC) text specification draft 9," 11th Meeting: Shanghai, CN, Nov. 2, 2012, JCTVC-K1003_v7, 290 pp.

Bross et al., "High efficiency video coding (HEVC) text specification draft 10 (For FDIS & Last Call)," 12th Meeting: Geneva, CH, Mar. 19, 2013, JCTVC-L1003_v34, 310 pp.

ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.

ITU-T H.265, Series H: Audiovisual and Multimedia Systems, Infrastructure of audiovisual services—Coding of moving video, Advanced video coding for generic audiovisual services, The International Telecommunication Union. Apr. 2013, 317 pp.

ITU-T H.265, Series H: Audiovisual and Multimedia Systems, Infrastructure of audiovisual services—Coding of moving video, Advanced video coding for generic audiovisual services, The International Telecommunication Union. Oct. 2014, 540 pp.

ITU-T H.265, Series H: Audiovisual and Multimedia Systems, Infrastructure of audiovisual services—Coding of moving video, Advanced video coding for generic audiovisual services, The International Telecommunication Union. Apr. 2015, 634 pp.

Flynn et al., "High Efficiency Video Coding (HEVC) Range Extensions text spedification: draft 6", 16th Meeting, San Jose, US, Jan. 9 through 17, 2014, (Joint Collaborative Team on Video Coding (JCT-VC) of ITU-T SG 16 WP 3 and ISO/IEC JTC 1/SC 29WG 11), JCTVC-P1005_v4, Apr. 3, 2014, 370 pp.

Rojals et al., "Transform Coefficient Coding in HEVC", IEEE Transactions on Circuits and Systems for Video Technology, vol. 22, No. 12, Dec. 2012, 13 pp.

Sharman et al., "AHG18: Worst-Case Escape Code Length Mitigation", 16th Meeting, San Jose, US, Jan. 9 through 17, 2014, (Joint Collaborative Team on Video Coding (JCT-VC) of ITU-T SG 16 WP 3 and ISO/IEC JTC 1/SC 29/WG 11), JCTVC-P0061_v2, Jan. 7, 2014, 5 pp.

Budagavi et al., Coeff_abs_level_remaining maximum codeword length reduction:, 10th Meeting, Stockholm, SE Jul. 11 through 20, 2012, (Joint Collaborative Team on Video Coding (JCT-VC) of ITU-T SG 16 WP 3 and ISO/IEC JTC 1/SC 29/WG 11), JCTVC-J0142_v6, Jan. 7, 2014, 14 pp.

Amonou et al., "Description of video coding technology proposal by France Telecom, NTT, NTT DOCOMO, Panasonic and Technicolor", 1st Meeting, Dresden, DE, Apr. 15 through 23, 2010, (Joint Collaborative Team on Video Coding (JCT-VC) of ITU-T SG 16 WP 3 and ISO/IEC JTC 1/SC 29/WG 11); JCTVC-A114, Mar. 19, 2012, 42 pp.

Alshin et al., "Multi-parameter probability up-date for CABAC", 6th Meeting, Torino, IT, Jul. 15 through 22, 2011 ( Joint collaborative Team on Video Coding (JCT-VC) of ITU-T SG 16 WP 3 and ISO/IEC JTC 1/SC 29/WG 11); JCTVC-F254_v5, Jul. 12, 2011, 5 pp.

Response to Written Opinion dated Jul. 31, 2015, from International Application No. PCT/US2015/020462, filed on Janaury 14, 2016, 8 pp.

Bross et al., "High efficiency video coding (HEVC) text specification draft 10 (For FDIS & Last Call)," Jan. 14-23, 2013; 12th Meeting: Geneva, CH, Jan. 28, 2013, JCTVC-L1003_v10, 310 pp.

Bross et al., "High efficiency video coding (HEVC) text specification draft 10 (For FDIS & Last Call)," Jan. 14-23, 2013; 12th Meeting: Geneva, CH, Jan. 28, 2013, JCTVC-L1003_v11, 310 pp.

International Preliminary Report on Patentability from International Application No. PCT/US2015/020462, dated Aug. 24, 2016, 8 pp.

* cited by examiner

US 9,930,348 B2

COEFFICIENT LEVEL CODING IN A VIDEO CODING PROCESS

This application claims priority to U.S. Provisional Application No. 61/953,659, filed Mar. 14, 2014, and U.S. Provisional Application No. 61/954,404, filed Mar. 17, 2014, the entirety of both of which is incorporated herein by reference.

TECHNICAL FIELD

This disclosure relates to video coding, and more particularly to techniques for coding transform coefficients.

BACKGROUND

Digital video capabilities can be incorporated into a wide range of devices, including digital televisions, digital direct broadcast systems, wireless broadcast systems, personal digital assistants (PDAs), laptop or desktop computers, digital cameras, digital recording devices, digital media players, video gaming devices, video game consoles, cellular or satellite radio telephones, video teleconferencing devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard presently under development, and extensions of such standards, to transmit, receive and store digital video information more efficiently.

Video compression techniques include spatial prediction and/or temporal prediction to reduce or remove redundancy inherent in video sequences. For block-based video coding, a video frame or slice may be partitioned into blocks. A video frame alternatively may be referred to as a picture. Each block can be further partitioned. Blocks in an intra-coded (I) frame or slice are encoded using spatial prediction with respect to reference samples in neighboring blocks in the same frame or slice. Blocks in an inter-coded (P or B) frame or slice may use spatial prediction with respect to reference samples in neighboring blocks in the same frame or slice or temporal prediction with respect to reference samples in other reference frames. Spatial or temporal prediction results in a predictive block for a block to be coded. Residual data represents pixel differences between the original block to be coded, i.e., the coded block, and the predictive block.

An inter-coded block is encoded according to a motion vector that points to a block of reference samples forming the predictive block, and the residual data indicating the difference between the coded block and the predictive block. An intra-coded block is encoded according to an intra-coding mode and the residual data. For further compression, the residual data may be transformed from the pixel domain to a transform domain, resulting in residual transform coefficients, which then may be quantized. The quantized transform coefficients, initially arranged in a two-dimensional array, may be scanned in a particular order to produce a one-dimensional vector of transform coefficients for entropy coding.

SUMMARY

In general, this disclosure describes techniques for coding video data. In particular, this disclosure describes techniques for coding information relating to transform coefficients in a video coding process.

When coding a block of video data, a video coder (e.g. a video encoder or decoder) determines a predictive block, and a residual block that indicates pixel-by-pixel differences between the predictive block and the original block of video data to be coded. Each residual block may be transformed (and possibly quantized) to create transform coefficients. Each coefficient of the transform coefficients may be coded by a video coder in one or more syntax elements, including a syntax element that codes the absolute value of the transform coefficient ("coeff_abs_level_remaining").

To code the transform coefficients from a decimal representation into binary (referred to as binarization), an HEVC (high efficiency video coding) video coder may use Golomb-Rice/Exponential-Golomb coding to code some syntax elements. The techniques of this disclosure improve upon the existing HEVC techniques used, and improve the worst-case (i.e. maximum) bit length required to code an coeff_abs_level_remaining syntax element.

In one example of the disclosure, a method for decoding video includes: determining a maximum number of bits to be used when decoding an encoded syntax element indicating absolute values of transform coefficients of a coded unit of video data, determining a maximum number of suffix bits to be used when decoding a Golomb-Rice/Exponential-Golomb coding suffix codeword of the syntax element indicating the absolute values of the coefficients, wherein the maximum number of suffix bits is based on the maximum number the maximum number of bits to be used when coding each of the absolute values of the transform coefficients. The method further includes determining a maximum number of prefix bits to be used when decoding a unary Golomb-Rice/Exponential-Golomb coding prefix codeword of the syntax element indicating absolute values of the coefficients, wherein the maximum number of prefix bits is based on the maximum number of suffix bits, receiving from an encoded video bitstream the syntax element indicating the absolute values of transform coefficients for the coding unit of video data, decoding a prefix codeword for one of absolute values of the coefficients, wherein the prefix codeword has a number of bits that is less than or equal to the maximum number of prefix bits, and decoding a suffix codeword for one of the coefficients, wherein the suffix codeword has a number of bits that is less than or equal to the maximum number of suffix bits, wherein the suffix codeword is concatenated to the prefix codeword. The method also further includes determining an absolute value for the one of the transform coefficients based on the decoded prefix and the decoded suffix, and decoding the coding unit based on the determined absolute value of the transform coefficients.

In another example, a method for encoding video includes: generating transform coefficients for a coding unit of video data, determining a maximum number of bits to be used when encoding a syntax element indicating absolute values of the transform coefficients of the coding unit of video data, and determining a maximum number of suffix bits to be used when encoding a Golomb-Rice/Exponential-Golomb coding suffix codeword of the syntax element indicating the absolute values of the coefficients, wherein the maximum number of suffix bits is based on the maximum number of bits to be used when encoding each of the absolute values of the transform coefficients. The method further includes determining a maximum number of prefix bits to be used when encoding a unary Golomb-Rice/Exponential-Golomb coding prefix codeword of the syntax element indicating absolute values of the coefficients, wherein the maximum number of prefix bits is based on the maximum number of suffix bits, encoding a prefix codeword for one of the absolute values of the transform coefficients, wherein the prefix codeword has a number of bits that is less than or equal to the maximum number of prefix bits, and encoding a suffix codeword for one of the absolute values of the transform coefficients, wherein the suffix codeword has a number of bits that is less than or equal to the maximum number of suffix bits, wherein the suffix codeword is concatenated to the prefix codeword. The method further includes generating the syntax element into an encoded bitstream, and encoding the coding unit based on the encoded prefix codeword and the encoded suffix codeword.

In another example, a device for coding video data includes a memory configured to store video data and at least one processor configured to: determine a maximum number of bits to be used when coding a syntax element indicating absolute values of transform coefficients of a coding unit of the video data, determine a maximum number of suffix bits to be used when coding a Golomb-Rice/Exponential-Golomb coding suffix codeword of the syntax element indicating the absolute values of the coefficients, wherein the maximum number of suffix bits is based on the maximum number of bits to be used when coding each of the absolute values of the transform coefficients, determine a maximum number of prefix bits to be used when coding a unary Golomb-Rice/Exponential-Golomb coding prefix codeword of the syntax element indicating the absolute values of the coefficients, wherein the maximum number of prefix bits is based on the maximum number of suffix bits, and determine the absolute values of transform coefficients for the coding unit. The at least one processor is further configured to: code a prefix codeword for one of the absolute values of the transform coefficients, wherein the prefix codeword has a number of bits that is less than or equal to the maximum number of prefix bits, and code a suffix codeword for the one of the absolute values of the coefficients, wherein the suffix codeword has a number of bits that is less than or equal to the maximum number of suffix bits, wherein the suffix codeword is concatenated to the prefix codeword, and code the coding unit based on the prefix codeword and the suffix codeword.

In another example, a device includes: means for determining a maximum number of bits to be used when coding a syntax element indicating absolute values of transform coefficients of a coding unit of video data, means for determining a maximum number of suffix bits to be used when coding a Golomb-Rice/Exponential-Golomb coding suffix codeword of the syntax element indicating the absolute values of the coefficients, wherein the maximum number of suffix bits is based on the maximum number of bits to be used when coding each of the absolute values of the transform coefficients, and means for determining a maximum number of prefix bits to be used when decoding a unary Golomb-Rice/Exponential-Golomb coding prefix codeword of the syntax element indicating the absolute values of the coefficients, wherein the maximum number of prefix bits is based on the maximum number of suffix bits. The device further includes means for determining the absolute values of transform coefficients for the coding unit, means for coding a prefix codeword for one of the absolute values of the coefficients, wherein the prefix codeword has a number of bits that is less than or equal to the maximum number of prefix bits, and means for coding a suffix codeword for one of the coefficients, wherein the suffix codeword has a number of bits that is less than or equal to the maximum number of suffix bits, wherein the suffix codeword is concatenated to the prefix codeword, and means for coding the coding unit based on the prefix codeword and the suffix codeword.

In another example of the disclosure, a non-transitory computer-readable storage medium includes instructions that, when executed, cause at least one processor to: determine a maximum number of bits to be used when coding a syntax element indicating absolute values of transform coefficients of a coding unit of the video data, determine a maximum number of suffix bits to be used when coding a Golomb-Rice/Exponential-Golomb coding suffix codeword of the syntax element indicating the absolute values of the coefficients, wherein the maximum number of suffix bits is based on the maximum number of bits to be used when coding each of the absolute values of the transform coefficients, determine a maximum number of prefix bits to be used when coding a unary Golomb-Rice/Exponential-Golomb coding prefix codeword of the syntax element indicating the absolute values of the coefficients, wherein the maximum number of prefix bits is based on the maximum number of suffix bits, and determine the absolute values of transform coefficients for the coding unit. The non-transitory computer-readable storage medium further includes instructions that, when executed, cause the at least one processor to: code a prefix codeword for one of the absolute values of the transform coefficients, wherein the prefix codeword has a number of bits that is less than or equal to the maximum number of prefix bits, and code a suffix codeword for the one of the absolute values of the coefficients, wherein the suffix codeword has a number of bits that is less than or equal to the maximum number of suffix bits, wherein the suffix codeword is concatenated to the prefix codeword, and code the coding unit based on the prefix codeword and the suffix codeword.

The details of one or more examples are set forth in the accompanying drawings and the description below. Other features, objects, and advantages will be apparent from the description and drawings, and from the claims.

DETAILED DESCRIPTION

Figure 1:
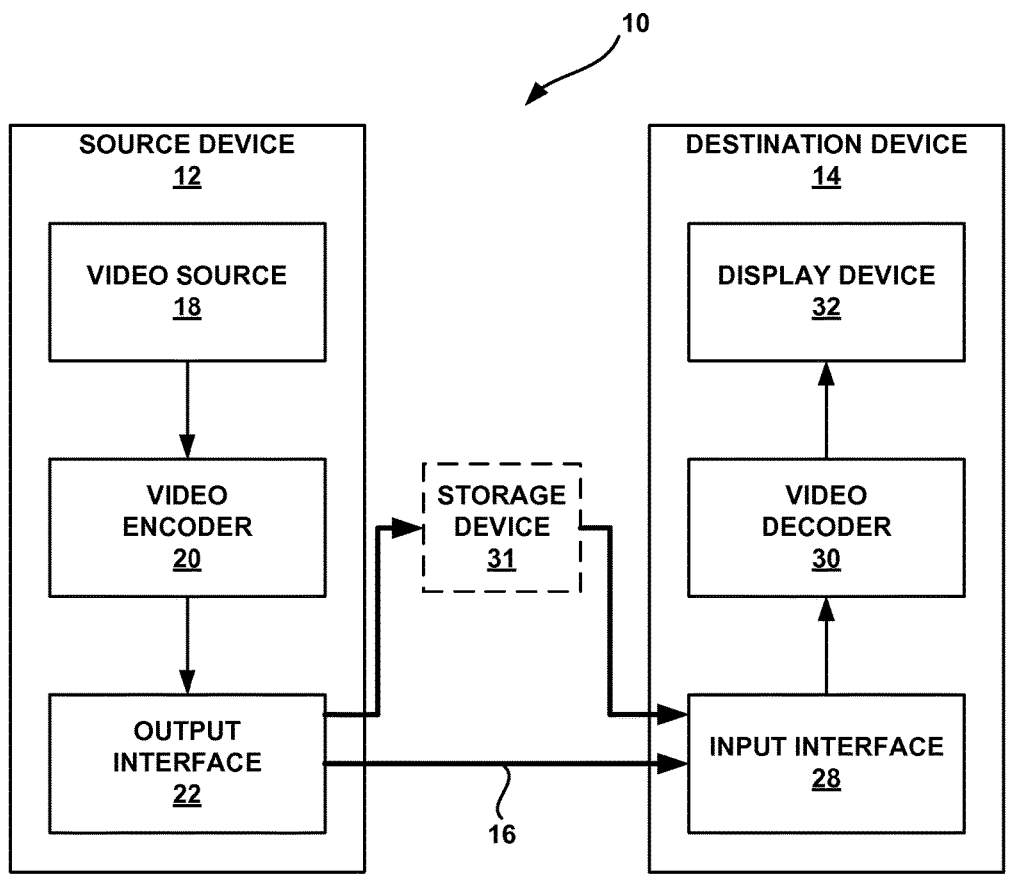
FIG. 1 is a block diagram illustrating an example video encoding and decoding system that may be configured or otherwise operable to implement or otherwise utilize one or more techniques described in this disclosure.

A video coder (e.g., a video encoder or a video encoder or a video decoder) configured to code video data standards may transform or inversely transform samples of a block of video data into transformed coefficient levels using a transform function. The video coder may further code the transformed coefficient levels using a process referred to as binarization.

A video coder configured in accordance with the High Efficiency Video Coding (HEVC) standard may code the coefficient levels using Rice-Golomb/Exponential Golomb coding. However, for samples having so-called extended precision relative to the HEVC base standard, the worst-case binarized transform levels may have a code length that may not fit into a single register word of a processor. The techniques of this disclosure reduce the length of binarized transformed coefficient levels to 32-bits by using a binarization that may have a maximum number of bits, a maximum number of prefix bits, and a maximum number of suffix bits. In some examples, the maximum suffix length may be based on a bit-depth of a sample component.

Video coding standards include ITU-T H.261, ISO/IEC MPEG-1 Visual, ITU-T H.262 or ISO/IEC MPEG-2 Visual. ITU-T H.263, ISO/IEC MPEG-4 Visual and ITU-T H.264 (also known as ISO/IEC MPEG-4 AVC), including its Scalable Video Coding (SVC) and Multiview Video Coding (MVC) extensions. The latest joint draft of H.264/MVC is described in "Advanced video coding for generic audiovisual services," ITU-T Recommendation H.264, March 2010.

In addition, the HEVC standard has been recently developed by the Joint Collaboration Team on Video Coding (JCT-VC) of ITU-T Video Coding Experts Group (VCEG) and ISO/IEC Motion Picture Experts Group (MPEG). A recent draft of HEVC, referred to as "HEVC Working Draft 10"or" WD10," described in document JCTVC-L1003v34, Bross et al., "High efficiency video coding (HEVC) text specification draft 10 (for FDIS & Last Call)," Joint Collaborative Team on Video Coding (JCT-VC) of ITU-T SG16 WP3 and ISO/IEC JTC1/SC29/WG11, 12th Meeting: Geneva, CH, 14-23 Jan., 2013, available from: http://phenix.int-evry.fr/jct/doc_end_user/documents/12_Geneva/wg11/JCTVC-L1003-v34.zip.

In general, this disclosure describes techniques for coding video data. In particular, this disclosure describes techniques for binary arithmetic coding of residual transform coefficients in a video encoding and/or decoding process. When coding a block of video data, a video coder determines a predictive block, and a residual block that indicates pixel-by pixel differences between the predictive block and the original block of video data to be coded. Each residual block may be transformed into transform coefficients. These transform coefficients may then be entropy coded using context adaptive binary arithmetic coding (CABAC) entropy coders or other entropy coders, such as probability interval partitioning entropy coding (PIPE) or related coders. Arithmetic coding is a form of entropy coding used in many compression algorithms that have high coding efficiency, because it is capable of mapping symbols to non-integer length codewords. An example of an arithmetic coding algorithm is Context-Adaptive Binary Arithmetic Coding (CABAC) used in H.264/AVC, as well as in the High Efficiency Video Coding (HEVC) video standard.

A video coder operating according to the HEVC standards may be configured to partition a frame or picture of video into coding tree units (CTUs) comprised of one or more coding units (CUs). A CU may further comprise one or more prediction units (PUs), and one or more transform units (TUs). A TU may comprise one or more blocks of transformed residual coefficients. In this disclosure, transform coefficients may describe a variety of different values. For example, transform coefficients may comprise transformed samples of a transform block, samples of a transform skip mode-coded block, samples of a transquant (transform and quantization) bypass-coded block. samples of a residual difference pulse code modulation (RDPCM)-coded block, or samples of an RDPCM-coded block coded using transquant bypass. Depending on the coding mode of a block, a video coder may quantize a block of transformed coefficients and generate quantized transform coefficients to further improve coding efficiency. The video coder may entropy code the block of quantized transform coefficients.

To entropy code a block of quantized transform coefficients, a video coder usually performs a scanning process so that the two-dimensional (2D) array of quantized transform coefficients in a block is rearranged, according to a particular scan order, into an ordered, one-dimensional (1D) array, i.e., vector, of transform coefficients. The video coder then applies entropy coding to the vector of transform coefficients. The scan of the quantized transform coefficients in a transform unit serializes the 2D array of transform coefficients for the entropy coder. The video coder may also generate a significance map to indicate the positions of significant (i.e., non-zero) coefficients. Scanning may be applied to scan levels of significant (i.e., nonzero) coefficients, and/or to code signs of the significant coefficients.

In the HEVC standard, position information of the significant transform (e.g., the significance map) is first coded for a TU to indicate the location of the last non-zero coefficient in the scan order. The significance map and the level information (the absolute values and signs of the coefficients) are coded for each coefficient in an inverse scan order.

In the HEVC standard, a video coder may group coefficients into a chunk. The significance map and level information (absolute value and sign) of the transform coefficients are coded for each chunk. In one example, a chunk consists of 16 consecutive coefficients along a scan order (e.g., a forward or inverse diagonal, horizontal, or vertical scan order) for a 4×4 TU and an 8×8 TU. For 16×16 and 32×32 TUs, a 4×4 subblock of transform coefficients within the larger TU are treated as a chunk. The following symbols (syntax elements) are coded and signaled to represent the significance of the coefficients and the coefficients level information within a chunk. In one example, all the symbols are encoded in an inverse scan order.

significant_coeff_flag (abbr. sigMapFlag): This flag indicates the significance of each coefficient in a chunk. A coefficient with an absolute value of one or greater is considered to be significant. As one example, a sigMapFlag value of 0 indicates that the coefficient is not significant, while a value of 1 indicates that the coefficient is significant. This flag may generally be referred to as a significance flag.

coeff_abs_level_greater1_flag (abbr. gr1Flag): This flag indicates whether the absolute value of the coefficient is larger than one for any non-zero coefficients (i.e., coefficients with sigMapFlag as 1). As one example, a gr1Flag value of 0 indicates that the coefficient does not have an absolute value greater than one, while a value of 1 for the gr1Flag indicates that the coefficient does have an absolute value greater than one. This flag may generally be referred to as a greater-than-one flag.

coeff_abs_level_greater2_flag (abbr. gr2Flag): This flag indicates whether the absolute value of the coefficient is larger than two for any coefficients with an absolute value larger than one (i.e., coefficients with gr1Flag as 1). As one example, a gr2Flag value of 0 indicates that the coefficient does not have an absolute value greater than two, while a value of 1 for the gr2Flag indicates that the coefficient does have an absolute value greater than two. This flag may generally be referred to as a greater-than-two flag.

coeff_sign_flag (abbr. signFlag): This flag indicates the sign information for any non-zero coefficients (i.e., coefficients with sigMapFlag as 1). For example, a zero for this flag indicates a positive sign, while a 1 indicates a negative sign.

coeff_abs_level_remaining (abbr. levelRem): This syntax element indicates the absolute level values of the remaining coefficients. For this flag, the absolute value of the coefficient minus three is coded (abs(level)-3) for each coefficient with an absolute value larger than two (i.e. coefficients with gr2Flag as 1). Rather than being a one-bit flag, the levelRem syntax element indicates the total absolute value of the transform coefficient that is greater than two.

To code some syntax elements (including the coeff_abs_level_remaining syntax element) for the transform coefficients into binary (referred to as binarization), an HEVC-compliant coder uses a technique known as Golomb-Rice/Exponential-Golomb coding. Exponential-Golomb coding is described in greater detail at: http://en.wikipedia.org/wiki/Exponential-Golomb_coding. The techniques of this disclosure improve upon the existing HEVC techniques used, and improve the worst-case (i.e. maximum) number of bits required to code the coeff_abs_level_remaining syntax element.

An extension to HEVC, referred to as the HEVC Range Extension (HEVC RExt), enables a compliant video coder to increase the dynamic range and fidelity of coded video data. A recent draft of the HEVC Range Extension, referred to as "HEVC RExt WD 6," is described in document JCTVC-P1005v4, Flynn et al., "High efficiency video coding (HEVC) Range Extensions text specification draft 6," Joint Collaborative Team on Video Coding (JCT-VC) of ITU-T SG16 WP3 and ISO/IEC JTC1/SC29/WG11, 16th Meeting: San Jose, US, 9-17 Jan., 2014, and is available from: http://phenix.int-evry.fr/jct/doc_end_user/documents/16_San%20Jose/wg11/JCTVC-P1005-v4.zip. For example, an HEVC range extension-compliant video coder may code chroma or luma samples having an increased number of bits relative to the HEVC base standard, e.g. 16 bits, which may improve the fidelity or quality of video relative to the HEVC base standard.

In HEVC, the length of the coeff_abs_level_remaining syntax element is restricted to 32 bits in the worst-case. This is considered desirable for implementation in hardware as well as in software. In HEVC, irrespective of the bit-depth a video component, the transform coefficients are restricted to be in a 16-bit range (from $-2^{15}$ to $(2^{15}-1)$, inclusive. Here the term "transform coefficients" also applies to prediction residuals when the transform is skipped or bypassed (lossless mode). Taking the significance map into account, the largest possible value for coeff_abs_level_remaining syntax element is $(2^{15}-1)$. Here, greater than 1 and greater than 2 flags are not taken into account because in some cases they may not be signaled. Instead coeff_abs_level_remaining is signaled directly after significance flag.

However, in the current HEVC range extensions specification, the range of transform coefficients when using extended precision is $-2^{(B+6)}$ to $2^{(B+6)}-1$, inclusive, where B is the bit-depth of a video component. For example, when using extended precision, for a 16-bit video component, the range of transform coefficients is $-2^{22}$ to $2^{22}-1$, inclusive. In this case, the Golomb-Rice/Exponential-Golomb method used by the current HEVC Range Extensions specification (and HEVC) produces worst-case length of 46 bits, which occurs when cRiceParam is 0.

Related to the number of bits for a channel, HEVC RExt WD 6 defines a new syntax element, log2TransformRange, for a video component of a coding unit as:

$$\text{Log2TransformRange}=\text{Max}(15,B+6),$$

where B is the bit-depth of a video component. Log2TransformRange may correspond to the range of values that may be used to represent coefficients when using an extended precision (i.e., a higher number of bits than the base HEVC standard) for samples. For example, when using extended precision, for a 16-bit video component, the range of values for transform coefficients is $-2^{22}$ to $2^{22}-1$, inclusive.

To code the absolute values of transform coefficients, an HEVC-compliant video coder codes the coeff_abs_level_remaining[n] syntax element, where "n" denotes an index of a scan position of a current block. According to the HEVC standard, a video coder codes the coeff_abs_level_remaining[n] syntax element using a combination of a Golomb-Rice coding prefix concatenated with an Exponential-Golomb code, which may include a suffix. This disclosure refers to the combination as "Golomb-Rice/Exponential-Golomb coding."

To code coeff_abs_level_remaining[n], a video coder determines a Rice parameter, referred to as the variable "cRiceParam." The Rice parameter is an exponent value, also referred to as the value "k." The Rice parameter is determined based on a previously-determined Rice parameter for the block if such a Rice parameter has been previously defined.

The video coder also determines a prefix bits which are represented by variable value prefixVal, and suffix bits, represented by the variable suffixVal. The concatenation of the prefix and suffix values defines the binarization of coeff_abs_level_remaining [n].

The HEVC standard, at Section 9.3.3.2 defines the process for determining the process for determining the Golomb-Rice coding portion of the prefix. According to the HEVC standard, at Section 9.3.3.3, the remaining bits of the prefix and suffix are determined according to a k-th order Exponential-Golomb (EGk) binarization process, the pseudocode for which is reproduced below:

```
absV = Abs( synVal )
stopLoop = 0
do {
        if( absV >= ( 1 << k ) ) {
                put( 1 )
                absV = absV - ( 1 << k )
                k++
        } else {
                put( 0 )
                while( k- - )
                        put( ( absV >> k ) & 1 )
                stopLoop = 1
        }
} while( !stopLoop ).
```

The techniques of this disclosure may improve the coding efficiency of the Golomb-Rice/Exponential-Golomb binarization of the coeff_abs_level_remaining[n] syntax element in certain cases.

HEVC RExt WD 6, allows a video encoder to signal the extended_precision_processing_flag syntax element equal to 1 to signal that the video is encoded using a greater bit-depth relative to the HEVC base standard. The HEVC RExt WD 6, Golomb-Rice/Exponential-Golomb coding method used by the current HEVC Range Extensions specification may require a maximum, worst-case length, of 46 bits in some cases (e.g., when the syntax value indicating a rice parameter, cRiceParam, is 0) for transform levels having extended precision.

Lengths of greater than 32 bits may not fit into registers of 32-bit processors, and may cause other issues related to padding bits of a non-instruction-word-length syntax elements. The techniques described herein may limit the worst-case length for the coeff_abs_level_remaining syntax element to 32 bits, which enable the binarization of coeff_abs_level_remaining[n] to fit into a single processor instruction word.

To reduce the worst-case length of coeff_abs_level_remaining[n], this disclosure introduces a max_suffix_length parameter. In various examples, max_suffix_length may be equal to the value of a Log2TransformRange variable. According to HEVC RExt WD6, Log2TransformRange may be equal to max(15, B+6), where B is the bit-depth of a video component. Thus, the value of Log2TransformRange may also equal to the maximum number of bits needed to represent the value of the coeff_abs_level_remaining syntax element that may be present in a conforming bit-stream. Setting the max_suffix_length parameter equal to the value of Log2TransformRange in various examples takes into account the fact that the significance value as well as greater than 1 and greater than 2 flags for a coefficient are sent separately.

This disclosure also introduces another parameter, referred to as max_prefix_length. In various examples, max_prefix_length may be defined as:

$$\text{max\_prefix\_length} = 32 - \text{max\_suffix\_length} \quad (2).$$

Thus, for a 16-bit video component, max_suffix_length is equal to 22, and max_prefix_length is equal to 10. Table 1, below, shows an example of the existing binarization of coeff_abs_level_remaining syntax element using the prefix and suffix coding according to HEVC RExt WD 6.

TABLE 1

Existing binarization for coeff_abs_level_remaining syntax element

| Input Value | Codeword prefix | Codeword suffix | Prefix code length | Suffix code length | Total codeword length |
|---|---|---|---|---|---|
| 0 | 0 | | 1 | 0 | 1 |
| 1 | 10 | | 2 | 0 | 2 |
| 2 | 110 | | 3 | 0 | 3 |
| 3 | 1110 | | 4 | 0 | 4 |
| [4, 5] | 11110 | X | 5 | 1 | 6 |
| [6, 9] | 111110 | Xx | 6 | 2 | 8 |
| [10, 17] | 1111110 | Xxx | 7 | 3 | 10 |
| [18, 33] | 11111110 | Xxxx | 8 | 4 | 12 |
| [34, 65] | 111111110 | Xxxxx | 9 | 5 | 14 |
| [66, 129] | 1111111110 | Xxxxxx | 10 | 6 | 16 |
| [130, 257] | 11111111110 | Xxxxxxx | 11 | 7 | 18 |

TABLE 1-continued

Existing binarization for coeff_abs_level_remaining syntax element

| Input Value | Codeword prefix | Codeword suffix | Prefix code length | Suffix code length | Total codeword length |
|---|---|---|---|---|---|
| [258, 513] | 111111111110 | xxxxxxxx | 12 | 8 | 20 |
| . . . | . . . | . . . | . . . | . . . | . . . |

As discussed above, currently, the codeword prefix is a unary representation. This disclosure codes the prefix using a truncated unary representation having a maximum prefix length of max_prefix_bits. For the last interval (represented by 1111 . . . max_prefix_bits times), the suffix length is set to the value of max_suffix_bits. By contrast, the last interval terminates with an additional "0" according to the HEVC standard. Since max_suffix_bits are sufficient to represent the maximum absolute value of transform coefficients in the bit-stream, the last interval in the last row of Table 1 covers all values of interest.

Table 2 illustrates another example for a video having a component bit-depth of 16 and cRiceRapram=0. In the example of Table 2. max_suffix_bits is equal to 22 and max_prefix_bits=10. The maximum value for the coeff_abs_level_remaining syntax element (taking the significance map into account) is $(2^{22}-1)$ or 4194303, which is described by the last row.

TABLE 2

Proposed binarization for bit-depth = 16, cRiceParam = 0

| Input Value | Codeword prefix | Codeword suffix | Prefix code length | Suffix code length | Total codeword length |
|---|---|---|---|---|---|
| 0 | 0 | | 1 | 0 | 1 |
| 1 | 10 | | 2 | 0 | 2 |
| 2 | 110 | | 3 | 0 | 3 |
| 3 | 1110 | | 4 | 0 | 4 |
| [4, 5] | 11110 | x | 5 | 1 | 6 |
| [6, 9] | 111110 | xx | 6 | 2 | 8 |
| [10, 17] | 1111110 | xxx | 7 | 3 | 10 |
| [18, 33] | 11111110 | xxxx | 8 | 4 | 12 |
| [34, 65] | 111111110 | xxxxx | 9 | 5 | 14 |
| [66, 129] | 1111111110 | xxxxxx | 10 | 6 | 16 |
| [130, 4194433] | 1111111111 | xxx . . . 22 times | 10 | 22 | 32 |

Table 3 illustrates another example in accordance with the techniques of this disclosure. Table 4 shows an example of the binarization for coeff_abs_level_remaining for a video component having a bit-depth equal to 12 and cRiceRapram=0. In this example, max_suffix_bits is equal to 18 and max_prefix_bits is equal to 14. The maximum value for the coeff_abs_level_remaining syntax element (taking the significance map into account) is $(2^{18}-1)$ or 262143, which is described by the last row of Table 3. Note that in Table 3, the final prefix value, 111 . . . 14 times, is a truncated unary representation rather than a unary representation.

TABLE 3

Proposed binarization for bit-depth = 12, cRiceParam = 0

| Input Value | Codeword prefix | Codeword suffix | Prefix code length | Suffix code length | Total codeword length |
|---|---|---|---|---|---|
| 0 | 0 | | 1 | 0 | 1 |
| 1 | 10 | | 2 | 0 | 2 |

TABLE 3-continued

Proposed binarization for bit-depth = 12, cRiceParam = 0

| Input Value | Codeword prefix | Codeword suffix | Prefix code length | Suffix code length | Total codeword length |
|---|---|---|---|---|---|
| 2 | 110 | | 3 | 0 | 3 |
| 3 | 1110 | | 4 | 0 | 4 |
| [4, 5] | 11110 | x | 5 | 1 | 6 |
| [6, 9] | 111110 | xx | 6 | 2 | 8 |
| [10, 17] | 1111110 | xxx | 7 | 3 | 10 |
| [18, 33] | 11111110 | xxxx | 8 | 4 | 12 |
| [34, 65] | 111111110 | xxxxx | 9 | 5 | 14 |
| [66, 129] | 1111111110 | xxxxxx | 10 | 6 | 16 |
| [130, 257] | 11111111110 | xxxxxxx | 11 | 7 | 18 |
| [258, 513] | 111111111110 | xxxxxxxx | 12 | 8 | 20 |
| [514, 1025] | 1111111111110 | xxxxxxxxx | 13 | 9 | 22 |
| [1026, 2049] | 11111111111110 | xxxxxxxxxx | 14 | 10 | 24 |
| [2050, 264193] | 11111111111111 | xxx . . . 18 times | 14 | 18 | 32 |

Table 4, below, illustrates yet another example of the proposed binarization techniques of this disclosure for a bit-depth of 16, and cRiceparam equal to 2.

TABLE 4

Proposed binarization for bit-depth = 16, cRiceParam = 2

| Input Value | Codeword prefix | Codeword suffix | Prefix code length | Suffix code length | Total codeword length |
|---|---|---|---|---|---|
| [0, 3] | 0 | xx | 1 | 2 | 3 |
| [4, 7] | 10 | xx | 2 | 2 | 4 |
| [8, 11] | 110 | xx | 3 | 2 | 5 |
| [12, 15] | 1110 | xx | 4 | 2 | 6 |
| [16, 23] | 11110 | xxx | 5 | 3 | 8 |
| [24, 39] | 111110 | xxxx | 6 | 4 | 10 |
| [40, 71] | 1111110 | xxxxx | 7 | 5 | 12 |
| [72, 135] | 11111110 | xxxxxx | 8 | 6 | 14 |
| [136, 263] | 111111110 | xxxxxxx | 9 | 7 | 16 |
| [264, 519] | 1111111110 | xxxxxxxx | 10 | 8 | 18 |
| [520, 4194823] | 1111111111 | xxx . . . 22 times | 10 | 22 | 32 |

One of features of the techniques of this disclosure for binarization is that the binarization of coeff_abs_level_remaining syntax element is dependent on the bit-depth of the video component or alternatively on the dynamic range of the transform coefficients.

It should also be noted that even for high values of cRiceParam, the proposed binarization restricts the worst-case codeword length to 32 bits. As another example, consider a bit-depth equal to 16 and cRiceRapram=20. In this case, the proposed binarization is shown below in Table 5. It may appear that the 32-bit length is being exceeded. However, as illustrated in Table 5, the first 4 rows are sufficient to represent the maximum value for the coeff_abs_level_remaining syntax element (taking the significance map into account), which is ($2^{22}-1$) or 4194303. Thus the rest of the rows are never used.

TABLE 5

Proposed binarization for bit-depth = 16, cRiceParam = 20

| Input value | Codeword prefix | Prefix code length | Suffix code length | Total codeword length |
|---|---|---|---|---|
| [0, 1048575] | 0 | 1 | 20 | 21 |
| [1048576, 2097151] | 10 | 2 | 20 | 22 |
| [2097152, 3145727] | 110 | 3 | 20 | 23 |
| [3145728, 4194303] | 1110 | 4 | 20 | 24 |
| . . . | 11110 | 5 | 21 | 26 |
| | 111110 | 6 | 22 | 28 |
| | 1111110 | 7 | 23 | 30 |
| | 11111110 | 8 | 24 | 32 |
| | 111111110 | 9 | 25 | 34 |
| | 1111111110 | 10 | 26 | 36 |
| | 1111111111 | 10 | 22 | 32 |

Some alternative binarization examples will now be discussed. In some examples, instead of using a truncated unary representation for the prefix. it may be possible for a video coder configured, in accordance with the techniques of this disclosure, to use a unary representation for the prefix. In this case, the last 2 rows of Tables 2-5 are merged into a single row. The example of Table 3 is illustrated using a non-truncated unary representation below in Table 6.

TABLE 6

Proposed binarization for bit-depth = 16, cRiceParam = 0 (unary representation for suffix)

| Input Value | Codeword prefix | Codeword suffix | Prefix code length | Suffix code length | Total codeword length |
|---|---|---|---|---|---|
| 0 | 0 | | 1 | 0 | 1 |
| 1 | 10 | | 2 | 0 | 2 |
| 2 | 110 | | 3 | 0 | 3 |
| 3 | 1110 | | 4 | 0 | 4 |
| [4, 5] | 11110 | x | 5 | 1 | 6 |
| [6, 9] | 111110 | xx | 6 | 2 | 8 |
| [10, 17] | 1111110 | xxx | 7 | 3 | 10 |
| [18, 33] | 11111110 | xxxx | 8 | 4 | 12 |
| [34, 65] | 111111110 | xxxxx | 9 | 5 | 14 |
| [66, 4194369] | 111111110 | xxx . . . 22 times | 10 | 22 | 32 |

The binarization in the example of Table 6 results in a greater number of required bits than the one proposed in Table 2. This is because, for input values in the range 66 to 129, inclusive, 22 suffix bits are used instead of 6. However, since HEVC and HEVC RExt WD 6 use unary representation for the suffix, such a binarization may be desirable to keep the binarization for lower bit-depths identical to the existing binarization.

In HEVC and the HEVC RExt WD 6 specification, there is no separate restriction on the dynamic range of transform coefficients in transform-skip and transform-bypass, i.e. lossless mode-coded blocks. For transform bypass blocks, the result of transforming blocks of a TU are prediction residual coefficients, so the maximum absolute value for the levels of the coefficients is restricted to the bit-depth of the video component that is being coded.

In some examples in accordance with the techniques of this disclosure, if a video coder restricts the dynamic range of the transform coefficients further for transform-skip and transform bypass (lossless mode) blocks, the video coder may change the binarization used to code the transform coefficients of the blocks depending on whether the block uses a regular transform, transform-skip or transform bypass modes. For example, in a case where a block is coded using a lossless mode. for a bit-depth of 16 bits, and cRiceParam equal to 0, a video coder may set max_suffix_bits equal to 16 and max_prefix_bits equal to 16. Possible binarizations for lossless mode in accordance with this example are shown in Table 6. below. The maximum value for the coeff_abs_level_remaining syntax element (taking significance map into account) in this example is $(2^{16}-1)$ or 65535, which is covered by the last row of Table 6. Thus, the techniques of this disclosure may improve coding efficiency of coeff_abs_level_remaining[n] for lossless mode-coded blocks.

TABLE 6

Proposed binarization for lossless mode (bit-depth = 16, cRiceParam = 0)

| Input value | Codeword prefix | Prefix code length | Suffix code length | Total codeword length |
| --- | --- | --- | --- | --- |
| 0 | 0 | 1 | 0 | 1 |
| 1 | 10 | 2 | 0 | 2 |
| 2 | 110 | 3 | 0 | 3 |
| 3 | 1110 | 4 | 0 | 4 |
| [4, 5] | 11110 | 5 | 1 | 6 |
| [6, 9] | 111110 | 6 | 2 | 8 |
| [10, 17] | 1111110 | 7 | 3 | 10 |
| [18, 33] | 11111110 | 8 | 4 | 12 |
| [34, 65] | 111111110 | 9 | 5 | 14 |
| [66, 129] | 1111111110 | 10 | 6 | 16 |
| [130, 257] | 11111111110 | 11 | 7 | 18 |
| [258, 513] | 111111111110 | 12 | 8 | 20 |
| [514, 1025] | 1111111111110 | 13 | 9 | 22 |
| [1026, 2049] | 11111111111110 | 14 | 10 | 24 |
| [2050, 4097] | 111111111111110 | 15 | 11 | 26 |
| [4098, 8193] | 1111111111111110 | 16 | 12 | 28 |
| [8194, 73729] | 1111111111111111 | 16 | 16 | 32 |

FIG. 1 is a block diagram illustrating an example video encoding and decoding system 10 that may utilize the techniques described in this disclosure. As shown in FIG. 1, system 10 includes a source device 12 that generates encoded video data to be decoded at a later time by a destination device 14. Source device 12 and destination device 14 may comprise any of a wide range of devices, including desktop computers, notebook (i.e., laptop) computers, tablet computers, set-top boxes, telephone handsets such as so-called "smart" phones, so-called "smart" pads, televisions, cameras, display devices. digital media players, video gaming consoles, video streaming device. or the like. In some cases, source device 12 and destination device 14 may be equipped for wireless communication.

Destination device 14 may receive the encoded video data to be decoded via a link 16. Link 16 may comprise any type of medium or device capable of moving the encoded video data from source device 12 to destination device 14. In one example, link 16 may comprise a communication medium to enable source device 12 to transmit encoded video data directly to destination device 14 in real-time. The encoded video data may be modulated according to a communication standard, such as a wireless communication protocol, and transmitted to destination device 14. The communication medium may comprise any wireless or wired communication medium, such as a radio frequency (RF) spectrum or one or more physical transmission lines. The communication medium may form part of a packet-based network, such as a local area network, a wide-area network, or a global network such as the Internet. The communication medium may include routers, switches, base stations, or any other equipment that may be useful to facilitate communication from source device 12 to destination device 14.

Alternatively, encoded data may be output from output interface 22 to a storage device 31. Similarly, encoded data may be accessed from storage device 31 by input interface. Storage device 31 may include any of a variety of distributed or locally accessed data storage media such as a hard drive, Blu-ray discs, DVDs, CD-ROMs, flash memory, volatile or non-volatile memory, or any other suitable digital storage media for storing encoded video data. In a further example, storage device 31 may correspond to a file server or another intermediate storage device that may hold the encoded video generated by source device 12. Destination device 14 may access stored video data from storage device 31 via streaming or download. The file server may be any type of server capable of storing encoded video data and transmitting that encoded video data to the destination device 14. Example file servers include a web server (e.g., for a website), an FTP server, network attached storage (NAS) devices, or a local disk drive. Destination device 14 may access the encoded video data through any standard data connection, including an Internet connection. This may include a wireless channel (e.g., a Wi-Fi connection), a wired connection (e.g., DSL, cable modem, etc.), or a combination of both that is suitable for accessing encoded video data stored on a file server. The transmission of encoded video data from storage device 31 may be a streaming transmission, a download transmission, or a combination of both.

The techniques of this disclosure are not necessarily limited to wireless applications or settings. The techniques may be applied to video coding in support of any of a variety of multimedia applications, such as over-the-air television broadcasts, cable television transmissions, satellite television transmissions, streaming video transmissions, e.g., via the Internet, encoding of digital video for storage on a data storage medium, decoding of digital video stored on a data storage medium, or other applications. In some examples, system 10 may be configured to support one-way or two-way video transmission to support applications such as video streaming, video playback, video broadcasting, and/or video telephony.

In the example of FIG. 1, source device 12 includes a video source 18, video encoder 20 and an output interface 22. In some cases, output interface 22 may include a modulator/demodulator (modem) and/or a transmitter. In source device 12, video source 18 may include a source such as a video capture device, e.g., a video camera, a video archive containing previously captured video, a video feed interface to receive video from a video content provider, and/or a computer graphics system for generating computer graphics data as the source video, or a combination of such sources. As one example, if video source 18 is a video camera, source device 12 and destination device 14 may form so-called camera phones or video phones. However, the techniques described in this disclosure may be applicable to video coding in general, and may be applied to wireless and/or wired applications.

The captured, pre-captured, or computer-generated video may be encoded by video encoder 20. The encoded video data may be transmitted directly to destination device 14 via output interface 22 of source device 12. The encoded video data may also (or alternatively) be stored onto storage device 31 for later access by destination device 14 or other devices, for decoding and/or playback.

Destination device 14 includes an input interface 28, a video decoder 30, and a display device 32. In some cases, input interface 28 may include a receiver and/or a modem. Input interface 28 of destination device 14 receives the encoded video data over link 16. The encoded video data communicated over link 16, or provided on storage device 31, may include a variety of syntax elements generated by video encoder 20 for use by a video decoder, such as video decoder 30, in decoding the video data. Such syntax elements may be included with the encoded video data transmitted on a communication medium, stored on a storage medium, or stored a file server.

Display device 32 may be integrated with, or external to, destination device 14. In some examples, destination device 14 may include an integrated display device and also be configured to interface with an external display device. In other examples, destination device 14 may be a display device. In general, display device 32 displays the decoded video data to a user, and may comprise any of a variety of display devices such as a liquid crystal display (LCD), a plasma display, an organic light emitting diode (OLED) display, or another type of display device.

Video encoder 20 and video decoder 30 may operate according to a video compression standard, such as the High Efficiency Video Coding (HEVC) standard presently under development, and may conform to the HEVC Test Model (HM). Alternatively, video encoder 20 and video decoder 30 may operate according to other proprietary or industry standards, such as the ITU-T H.264 standard, alternatively referred to as MPEG-4, Part 10, Advanced Video Coding (AVC), or extensions of such standards. The techniques of this disclosure, however, are not limited to any particular coding standard. Other examples of video compression standards include MPEG-2 and ITU-T H.263.

Although not shown in FIG. 1, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, in some examples, MUX-DEMUX units may conform to the ITU H.223 multiplexer protocol, or other protocols such as the user datagram protocol (UDP).

Video encoder 20 and video decoder 30 each may be implemented as any of a variety of suitable encoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 20 and video decoder 30 may be included in one or more encoders or decoders, either of which may be integrated as part of a combined encoder/decoder (CODEC) in a respective device.

Video encoder 20 and video decoder 30 may operate according to a video compression standard, such as the recently-standardized High Efficiency Video Coding (HEVC) standard, and may conform to the HEVC Test Model (HM). Document ITU-T H.265, SERIES H: AUDIO-VISUAL AND MULTIMEDIA SYSTEMS, Infrastructure of Audiovisual Services-Coding of Moving Video, "High Efficiency Video Coding," April 2013 describes the HEVC standard, and is hereby incorporated by reference in its entirety. Additionally, video encoder 20 and video decoder 30 may operate in accordance with an extension to the HEVC standard, such as the HEVC range extension, which may add additional visual dynamic range, quality improvements, coding modes, etc.

Alternatively, video encoder 20 and video decoder 30 may operate according to other proprietary or industry standards, such as the ITU-T H.264 standard, alternatively referred to as MPEG-4, Part 10, Advanced Video Coding (AVC), or extensions of such standards. The techniques of this disclosure, however, are not limited to any particular coding standard. Other examples of video compression standards include MPEG-2 and ITU-T H.263.

Although not shown in FIG. 1, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, in some examples, MUX-DEMUX units may conform to the ITU H.223 multiplexer protocol, or other protocols such as the user datagram protocol (UDP).

Video encoder 20 and video decoder 30 each may be implemented as any of a variety of suitable encoder circuitry, such as one or more microprocessors, digital signal processors (DSPs). application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 20 and video decoder 30 may be included in one or more encoders or decoders, either of which may be integrated as part of a combined encoder/decoder (CODEC) in a respective device.

Video encoder 20 may implement any or all of the techniques of this disclosure for coding transform coefficients in a video coding process. Likewise, video decoder 30 may implement any or all of these techniques for coding transform coefficients in a video coding process. A video coder, as described in this disclosure, may refer to a video encoder or a video decoder. Similarly, a video coding unit may refer to a video encoder or a video decoder. Likewise, video coding may refer to video encoding or video decoding.

In one example of the disclosure, video encoder 20 or video decoder 30 may be configured to determine a maximum number of bits to be used when coding a syntax element indicating absolute values of transform coefficients of a coding unit of the video data, determine a maximum number of suffix bits to be used when coding a Golomb-Rice/Exponential-Golomb coding suffix codeword of the syntax element indicating the absolute values of the coefficients, wherein the maximum number of suffix bits is based on the maximum number of bits to be used when coding each of the absolute values of the transform coefficients, and determine a maximum number of prefix bits to be used when coding a unary Golomb-Rice/Exponential-Golomb coding prefix codeword of the syntax element indicating the absolute values of the coefficients, wherein the maximum number of prefix bits is based on the maximum number of suffix bits.

Video encoder 20 or video decoder 30 may be further configured to determine the absolute values of transform coefficients for the coding unit, code a prefix codeword for one of the absolute values of the transform coefficients, wherein the prefix codeword has a number of bits that is less than or equal to the maximum number of prefix bits, and code a suffix codeword for the one of the absolute values of the coefficients, wherein the suffix codeword has a number of bits that is less than or equal to the maximum number of suffix bits, wherein the suffix codeword is concatenated to the prefix codeword and code the coding unit based on the prefix codeword and the suffix codeword.

Digital video devices implement video compression techniques to encode and decode digital video information more efficiently. Video compression may apply spatial (intra-frame) prediction and/or temporal (inter-frame) prediction techniques to reduce or remove redundancy inherent in video sequences.

For video coding according to the HEVC standard, a video frame may be partitioned into coding units. A coding unit (CU) generally refers to an image region that serves as a basic unit to which various coding tools are applied for video compression. A CU usually has a luminance component, denoted as Y, and two chroma components, denoted as U and V. Depending on the video sampling format, the size of the U and V components, in terms of number of samples, may be the same as or different from the size of the Y component.

A CU is typically square, and may be considered to be similar to a so-called macroblock, e.g., under other video coding standards such as ITU-T H.264. Coding according to some of the presently proposed aspects of the developing HEVC standard will be described in this application for purposes of illustration. However, the techniques described in this disclosure may be useful for other video coding processes, such as those defined according to H.264 or other standard or proprietary video coding processes.

According to the HM, a CU may include one or more prediction units (PUs) and/or one or more transform units (TUs). Syntax data within a bitstream may define a largest coding unit (LCU), which is a largest CU in terms of the number of pixels. In general, a CU has a similar purpose to a macroblock of H.264, except that a CU does not have a size distinction. Thus, a CU may be split into sub-CUs. In general, references in this disclosure to a CU may refer to a largest coding unit of a picture or a sub-CU of an LCU. An LCU may be split into sub-CUs, and each sub-CU may be further split into sub-CUs. Syntax data for a bitstream may define a maximum number of times an LCU may be split, referred to as CU depth. Accordingly, a bitstream may also define a smallest coding unit (SCU). This disclosure also uses the term "block" or "portion" to refer to any of a CU, PU, or TU. In general, "portion" may refer to any sub-set of a video frame.

An LCU may be associated with a quadtree data structure. In general, a quadtree data structure includes one node per CU, where a root node corresponds to the LCU. If a CU is split into four sub-CUs, the node corresponding to the CU includes four leaf nodes, each of which corresponds to one of the sub-CUs. Each node of the quadtree data structure may provide syntax data for the corresponding CU. For example, a node in the quadtree may include a split flag, indicating whether the CU corresponding to the node is split into sub-CUs. Syntax elements for a CU may be defined recursively, and may depend on whether the CU is split into sub-CUs. If a CU is not split further, it is referred as a leaf-CU. In this disclosure, 4 sub-CUs of a leaf-CU will also be referred to as leaf-CUs although there is no explicit splitting of the original leaf-CU. For example if a CU at 16×16 size is not split further, the four 8×8 sub-CUs will also be referred to as leaf-CUs although the 16×16 CU was never split.

A leaf-CU may include one or more prediction units (PUs). In general, a PU represents all or a portion of the corresponding CU, and may include data for retrieving a reference sample for the PU. For example, when the PU is inter-mode encoded, the PU may include data defining a motion vector for the PU. The data defining the motion vector may describe, for example, a horizontal component of the motion vector, a vertical component of the motion vector, a resolution for the motion vector (e.g., one-quarter pixel precision or one-eighth pixel precision), a reference frame to which the motion vector points, and/or a reference list (e.g., list 0 or list 1) for the motion vector. Data for the leaf-CU defining the PU(s) may also describe, for example, partitioning of the CU into one or more PUs. Partitioning modes may differ depending on whether the CU is uncoded, intra-prediction mode encoded, or inter-prediction mode encoded. For intra coding, a PU may be treated the same as a leaf transform unit described below.

The emerging HEVC standard allows for transformations according to transform units (TUs), which may be different for different CUs. The TUs are typically sized based on the size of PUs within a given CU defined for a partitioned LCU, although this may not always be the case. The TUs are typically the same size or smaller than the PUs. In some examples, residual samples corresponding to a CU may be subdivided into smaller units using a quadtree structure known as "residual quad tree" (RQT). The leaf nodes of the RQT may be referred to as transform units (TUs). Pixel difference values associated with the TUs may be transformed to produce transform coefficients, which may be quantized.

In general, a PU refers to data related to the prediction process. For example, when the PU is intra-mode encoded, the PU may include data describing an intra-prediction mode for the PU. As another example, when the PU is inter-mode encoded, the PU may include data defining a motion vector for the PU.

In general, a TU is used for the transform and quantization processes. A given CU having one or more PUs may also include one or more transform units (TUs). Following prediction, video encoder 20 may calculate residual values from the video block identified by the coding node in accordance with the PU. The coding node is then updated to reference the residual values rather than the original video block. The residual values comprise pixel difference values that may be transformed into transform coefficients, quantized, and scanned using the transforms and other transform information specified in the TUs to produce serialized transform coefficients for entropy coding. The coding node may once again be updated to refer to these serialized transform coefficients. This disclosure typically uses the term "video block" to refer to a coding node of a CU. In some specific cases, this disclosure may also use the term "video block" to refer to a treeblock, i.e., LCU, or a CU, which includes a coding node and PUs and TUs.

A video sequence typically includes a series of video frames or pictures. A group of pictures (GOP) generally comprises a series of one or more of the video pictures. A GOP may include syntax data in a header of the GOP, a header of one or more of the pictures, or elsewhere, that describes a number of pictures included in the GOP. Each slice of a picture may include slice syntax data that describes an encoding mode for the respective slice. Video encoder 20 typically operates on video blocks within individual video slices in order to encode the video data. A video block may correspond to a coding node within a CU. The video blocks may have fixed or varying sizes, and may differ in size according to a specified coding standard.

To code a block (e.g., a prediction unit of video data), a predictor for the block is first derived. The predictor, also referred to as a predictive block, can be derived either through intra (I) prediction (i.e., spatial prediction) or inter (P or B) prediction (i.e. temporal prediction). Hence, some prediction units may be intra-coded (I) using spatial prediction with respect to reference samples in neighboring reference blocks in the same frame (or slice), and other prediction units may be uni-directionally inter-coded (P) or bi-directionally inter-coded (B) with respect to blocks of reference samples in other previously-coded frames (or slices). In each case, the reference samples may be used to form a predictive block for a block to be coded.

Upon identification of a predictive block, the difference between the pixels in the original video data block and the pixels in its predictive block is determined. This difference may be referred to as the prediction residual data, and indicates the pixel differences between the pixel values in the block to the coded and the pixel values in the predictive block selected to represent the coded block. To achieve better compression, the prediction residual data may be transformed, e.g., using a discrete cosine transform (DCT), an integer transform, a Karhunen-Loeve (K-L) transform, or another transform to produce transform coefficients.

The residual data in a transform block, such as a TU, may be arranged in a two-dimensional (2D) array of pixel difference values residing in the spatial, pixel domain. A transform converts the residual pixel values into a two-dimensional array of transform coefficients in a transform domain, such as a frequency domain.

For further compression, the transform coefficients may be quantized prior to entropy coding. An entropy coder then applies entropy coding, such as Context Adaptive Variable Length Coding (CAVLC). Context Adaptive Binary Arithmetic Coding (CABAC), Probability Interval Partitioning Entropy Coding (PIPE), or the like, to the quantized transform coefficients.

The techniques of this disclosure improve upon the entropy coding and binarization techniques of the HEVC standard. Specifically, the techniques of this disclosure improve the efficiency of finalizing residual transform coefficients by limiting the number of prefix and suffix bits for exponential Golomb-Rice coding, as well as other techniques described above.

In some examples, video encoder 20 may utilize a predefined scan order to scan the quantized transform coefficients to produce a serialized vector that can be entropy encoded. In other examples, video encoder 20 may perform an adaptive scan. After scanning the quantized transform coefficients to form a one-dimensional vector, video encoder 20 may entropy encode the one-dimensional vector, Video encoder 20 may also entropy encode syntax elements associated with the encoded video data for use by video decoder 30 in decoding the video data.

Figure 2:
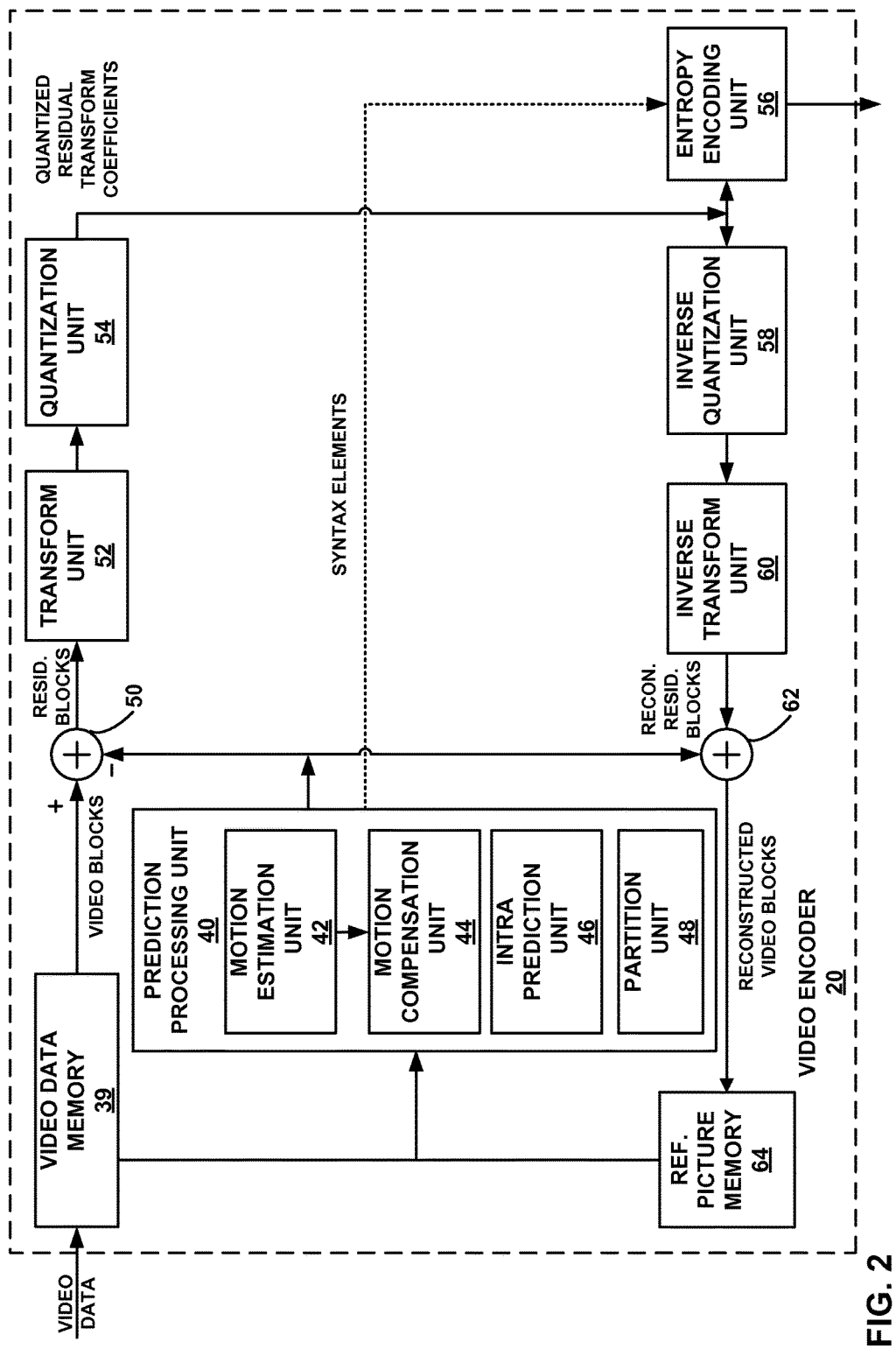
FIG. 2 is a block diagram illustrating an example of a video encoder that may be configured or otherwise operable to implement or otherwise utilize one or more techniques described in this disclosure.

FIG. 2 is a block diagram illustrating an example of video encoder 20 that may implement techniques for encoding video data, in accordance with one or more aspects of this disclosure. Video encoder 20 may perform intra- and inter-coding of video blocks within video slices. Intra-coding relies on spatial prediction to reduce or remove spatial redundancy in video within a given video frame or picture. Inter-coding relies on temporal prediction to reduce or remove temporal redundancy in video within adjacent frames or pictures of a video sequence. Intra-mode (I mode) may refer to any of several spatial based coding modes. Inter-modes, such as uni-directional prediction (P mode) or bi-prediction (B mode), may refer to any of several temporal-based coding modes.

As shown in FIG. 2, video data memory 39 receives video data that is used for encoding a current video block within a video frame. Video data memory 39 may store video data to be encoded by the components of video encoder 20 (e.g., configured to store video data). The video data stored in video data memory 39 may be obtained, for example, from video source 18. Reference frame buffer 64 (also referred to as reference picture buffer 64) is one example of a decoding picture buffer (DPB that stores reference video data for use in encoding video data by video encoder 20 (e.g., in intra or inter-coding modes, also referred to as intra- or inter-prediction coding modes). Video data memory 39 and reference frame buffer 64 may be formed by any of a variety of memory devices, such as dynamic random access memory (DRAM). including synchronous DRAM (SDRAM). magnetoresistive RAM (MRAM), resistive RAM (RRAM), or other types of memory devices. Video data memory 39 and reference frame buffer 64 may be provided by the same memory device or separate memory devices. In various examples, video data memory 39 may be on-chip with other components of video encoder 20. or off-chip relative to those components.

As shown in FIG. 2, video encoder 20 receives a current video block within a video frame to be encoded. In the example of FIG. 2, video encoder 20 includes prediction processing unit 40, reference picture memory 64, summer 50, transform processing unit 52, quantization unit 54, and entropy encoding unit 56. Prediction processing unit 41, in turn, includes motion compensation unit 44, motion estimation unit 42, and intra-prediction unit 46, and partition unit 48. For video block reconstruction, video encoder 20 also includes inverse quantization unit 58, inverse transform unit 60, and summer 62. A deblocking filter (not shown in FIG. 2) may also be included to filter block boundaries to remove blockiness artifacts from reconstructed video. If desired, the deblocking filter would typically filter the output of summer 62. Additional filters (in loop or post loop) may also be used in addition to the deblocking filter. Such filters are not shown for brevity, but if desired, may filter the output of summer 62 (as an in-loop filter).

During the encoding process, video encoder 20 receives a video frame or slice to be coded. The frame or slice may be divided into multiple video blocks by prediction processing unit 40. Motion estimation unit 42 and motion compensation unit 44 perform inter-predictive coding of the received video block relative to one or more blocks in one or more reference frames to provide temporal prediction. Intra-prediction unit 46 may alternatively perform intra-predictive coding of the received video block relative to one or more neighboring blocks in the same frame or slice as the block to be coded to provide spatial prediction. Video encoder 20 may perform multiple coding passes, e.g., to select an appropriate coding mode for each block of video data.

Moreover, partition unit 48 may partition blocks of video data into sub-blocks, based on evaluation of previous partitioning schemes in previous coding passes. For example, partition unit 48 may initially partition a frame or slice into LCUs, and partition each of the LCUs into sub-CUs based on rate-distortion analysis (e.g., rate-distortion optimization). Prediction processing unit 40 may further produce a quadtree data structure indicative of partitioning of an LCU into sub-CUs. Leaf-node CUs of the quadtree may include one or more PUs and one or more TUs.

Prediction processing unit 40 may select one of the coding modes, intra or inter, e.g., based on error results, and provides the resulting intra- or inter-coded block to summer 50 to generate residual block data and to summer 62 to reconstruct the encoded block for use as a reference frame. Prediction processing unit 40 also provides syntax elements, such as motion vectors, intra-mode indicators, partition information, and other such syntax information, to entropy encoding unit 56. Prediction processing unit 40 may select one or more inter-modes using rate-distortion analysis.

Motion estimation unit 42 and motion compensation unit 44 may be highly integrated, but are illustrated separately for conceptual purposes. Motion estimation, performed by motion estimation unit 42, is the process of generating motion vectors, which estimate motion for video blocks. A motion vector, for example, may indicate the displacement of a PU of a video block within a current video frame or picture relative to a predictive block within a reference frame (or other coded unit) relative to the current block being coded within the current frame (or other coded unit). A predictive block is a block that is found to closely match the block to be coded, in terms of pixel difference, which may be determined by sum of absolute difference (SAD), sum of square difference (SSD), or other difference metrics. In some examples, video encoder 20 may calculate values for sub-integer pixel positions of reference pictures stored in reference picture memory 64. For example, video encoder 20 may interpolate values of one-quarter pixel positions, one-eighth pixel positions, or other fractional pixel positions of the reference picture. Therefore, motion estimation unit 42 may perform a motion search relative to the full pixel positions and fractional pixel positions and output a motion vector with fractional pixel precision.

Motion estimation unit 42 calculates a motion vector for a PU of a video block in an inter-coded slice by comparing the position of the PU to the position of a predictive block of a reference picture. The reference picture may be selected from a first reference picture list (List 0) or a second reference picture list (List 1), each of which identify one or more reference pictures stored in reference picture memory 64. Motion estimation unit 42 sends the calculated motion vector to entropy encoding unit 56 and motion compensation unit 44.

Motion compensation, performed by motion compensation unit 44, may involve fetching or generating the predictive block based on the motion vector determined by motion estimation unit 42. Again, motion estimation unit 42 and motion compensation unit 44 may be functionally integrated, in some examples. Upon receiving the motion vector for the PU of the current video block, motion compensation unit 44 may locate the predictive block to which the motion vector points in one of the reference picture lists. Summer 50 forms a residual video block by subtracting pixel values of the predictive block from the pixel values of the current video block being coded, forming pixel difference values, as discussed below. In general, motion estimation unit 42 performs motion estimation relative to luma coding blocks, and motion compensation unit 44 uses motion vectors calculated based on the luma coding blocks for both chroma coding blocks and luma coding blocks. Prediction processing unit 40 may also generate syntax elements associated with the video blocks and the video slice for use by video decoder 30 in decoding the video blocks of the video slice.

Intra-prediction unit 46 may intra-predict a current block, as an alternative to the inter-prediction performed by motion estimation unit 42 and motion compensation unit 44. as described above. In particular, intra-prediction unit 46 may determine an intra-prediction mode to use to encode a current block. In some examples, intra-prediction unit 46 may encode a current block using various intra-prediction modes, e.g., during separate encoding passes, and intra-prediction unit 46 (or prediction processing unit 40, in some examples) may select an appropriate intra-prediction mode to use from the tested modes.

For example, intra-prediction unit 46 may calculate rate-distortion values using a rate-distortion analysis for the various tested intra-prediction modes, and select the intra-prediction mode having the best rate-distortion characteristics among the tested modes. Rate-distortion analysis generally determines an amount of distortion (or error) between an encoded block and an original, unencoded block that was encoded to produce the encoded block, as well as a bitrate (that is, a number of bits) used to produce the encoded block. Intra-prediction unit 46 may calculate ratios from the distortions and rates for the various encoded blocks to determine which intra-prediction mode exhibits the best rate-distortion value for the block.

After selecting an intra-prediction mode for a block, intra-prediction unit 46 may provide information indicative of the selected intra-prediction mode for the block to entropy encoding unit 56. Entropy encoding unit 56 may encode the information indicating the selected intra-prediction mode. Video encoder 20 may include in the transmitted bitstream configuration data, which may include a plurality of intra-prediction mode index tables and a plurality of modified intra-prediction mode index tables (also referred to as codeword mapping tables), definitions of encoding contexts for various blocks, and indications of a most probable intra-prediction mode, an intra-prediction mode index table, and a modified intra-prediction mode index table to use for each of the contexts.

Video encoder 20 forms a residual video block by subtracting the prediction data from prediction processing unit 40 from the original video block being coded. Summer 50 represents the component or components that perform this subtraction operation. Transform processing unit 52 applies a transform, such as a discrete cosine transform (DCT) or a conceptually similar transform, to the residual block, producing a video block comprising residual transform coefficient values. Transform processing unit 52 may perform other transforms which are conceptually similar to DCT. Wavelet transforms, integer transforms, sub-band transforms or other types of transforms could also be used. In any case, transform processing unit 52 applies the transform to the residual block, producing a block of residual transform coefficients. The transform may convert the residual information from a pixel value domain to a transform domain, such as a frequency domain. Transform processing unit 52 may send the resulting transform coefficients to quantization unit 54. Quantization unit 54 quantizes the transform coefficients to further reduce bit rate. The quantization process may reduce the bit depth associated with some or all of the coefficients. The degree of quantization may be modified by adjusting a quantization parameter. In some examples, quantization unit 54 may then perform a scan of the matrix including the quantized transform coefficients. Alternatively, entropy encoding unit 56 may perform the scan.

Following quantization, entropy encoding unit 56 entropy codes the quantized transform coefficients. For example, entropy encoding unit 56 may perform context adaptive variable length coding (CAVLC). context adaptive binary arithmetic coding (CABAC), syntax-based context-adaptive binary arithmetic coding (SBAC), probability interval partitioning entropy (PIPE) coding or another entropy coding technique. In the case of context-based entropy coding, context may be based on neighboring blocks. Following the entropy coding by entropy encoding unit 56, the encoded bitstream may be transmitted to another device (e.g., video decoder 30) or archived for later transmission or retrieval. Entropy encoding unit 56 may be configured to perform the techniques of this disclosure related to improving the efficiency of entropy coding and binarization of absolute values of transform coefficients, e.g., coeff_abs_level_remaining [n].

Inverse quantization unit 58 and inverse transform unit 60 apply inverse quantization and inverse transformation, respectively, to reconstruct the residual block in the pixel domain, e.g., for later use as a reference block. Motion compensation unit 44 may calculate a reference block by adding the residual block to a predictive block of one of the frames of reference picture memory 64. Motion compensation unit 44 may also apply one or more interpolation filters to the reconstructed residual block to calculate sub-integer pixel values for use in motion estimation. Summer 62 adds the reconstructed residual block to the motion compensated prediction block produced by motion compensation unit 44 to produce a reconstructed video block for storage in reference picture memory 64. The reconstructed video block may be used by motion estimation unit 42 and motion compensation unit 44 as a reference block to inter-code a block in a subsequent video frame.

After transforming sample values of a TU, transform processing unit 52 may separate the transformed coefficients into a sign value, and an absolute value of the transform coefficients, Transform processing unit 52 may signal the transformed coefficients to quantization unit 54. Quantization unit 54 may quantize the transform coefficients of a block if the block is not coded using lossless mode, and may signal the quantized or non-quantized transform coefficients to entropy encoding unit 56.

Entropy encoding unit 56 may encode the transform coefficients into the syntax elements described, including the significance map, which may be signaled by the significant_coeff_flag, and coeff_sign_flag, which indicates the sign of any non-zero coefficients.

Entropy encoding unit 56 may further encode the coeff_abs_level_remaining syntax element using a binarization having a prefix and an optional suffix using Golomb-Rice/Exponential-Golomb coding, as described above. The last interval of the prefix may be coded using a truncated unary representation in various examples. Additionally, entropy encoding unit 56 may encode the prefix and the suffix according to a maximum prefix length and a maximum suffix length, which may be based on a bit-depth of a block of video data.

In accordance with the techniques of this disclosure, video encoder 20 and in particular entropy encoding unit 56 may be configured to: generate transform coefficients for a coding unit of video data, determine a maximum number of bits to be used when encoding a syntax element indicating absolute values of the transform coefficients of the coding unit of video data, and determine a maximum number of suffix bits to be used when encoding a Golomb-Rice/Exponential-Golomb coding suffix codeword of the syntax element indicating the absolute values of the coefficients, wherein the maximum number of suffix bits is based on the maximum number of bits to be used when encoding each of the absolute values of the transform coefficients.

Entropy encoding unit 56 may be further configured to: determine a maximum number of prefix bits to be used when encoding a unary Golomb-Rice/Exponential-Golomb coding prefix codeword of the syntax element indicating absolute values of the coefficients, wherein the maximum number of prefix bits is based on the maximum number of suffix bits, encode a prefix codeword for one of the absolute values of the transform coefficients, wherein the prefix codeword has a number of bits that is less than or equal to the maximum number of prefix bits, and encode a suffix codeword for one of the absolute values of the transform coefficients, wherein the suffix codeword has a number of bits that is less than or equal to the maximum number of suffix bits, wherein the suffix codeword is concatenated to the prefix codeword. Entropy encoding unit 56 may generate the syntax element into an encoded bitstream, and encode the coding unit based on the encoded prefix codeword and the encoded suffix codeword.

Figure 3:
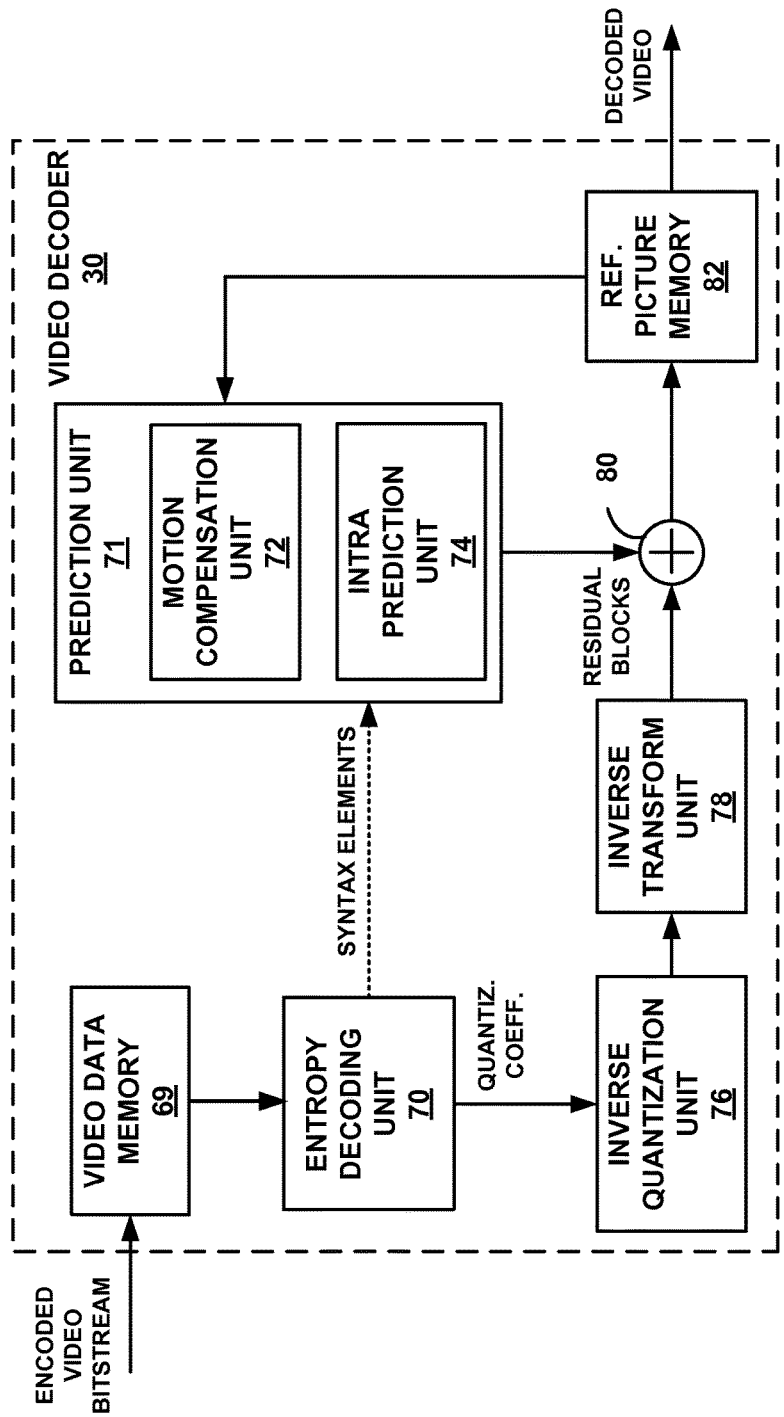
FIG. 3 is a block diagram illustrating an example of a video decoder that may be configured or otherwise operable to implement or otherwise utilize one or more techniques described in this disclosure.

FIG. 3 is a block diagram illustrating an example of video decoder 30 that may implement techniques for decoding video data, in accordance with one or more aspects of this disclosure. In the example of FIG. 3, video data memory 69 receives encoded video. Video data memory 69 may store video data (e.g., configured to store video data), such as an encoded video bitstream, to be decoded by the components of video decoder 30. The video data stored in video data memory 69 may be obtained from a local video source. such as a camera, via wired or wireless network communication of video data, or by accessing physical data storage media. Video data memory 69 may form a coded picture buffer (CPB) that stores encoded video data from an encoded video bitstream.

In the example of FIG. 3, video decoder 30 includes an entropy decoding unit 70. motion compensation unit 72, intra prediction unit 74, inverse quantization unit 76, inverse transform unit 78. summer 80, and reference picture memory 82. In the example of FIG. 2, video decoder 30 includes prediction unit 71, which, in turn, includes motion compensation unit 72 and intra prediction unit 74. Video decoder 30 may, in some examples, perform a decoding pass generally reciprocal to the encoding pass described with respect to video encoder 20 (FIG. 2). Motion compensation unit 72 may generate prediction data based on motion vectors received from entropy decoding unit 70, while intra prediction unit 74 may generate prediction data based on intra-prediction mode indicators received from entropy decoding unit 70.

During the decoding process, video decoder 30 receives an encoded video bitstream that represents video blocks of an encoded video slice and associated syntax elements from video encoder 20. Entropy decoding unit 70 of video decoder 30 entropy decodes the bitstream to generate quantized coefficients, motion vectors or intra-prediction mode indicators, and other syntax elements. Entropy decoding unit 70 forwards the motion vectors and other syntax elements to motion compensation unit 72. Video decoder 30 may receive the syntax elements at the video slice level and/or the video block level.

Entropy decoding unit 70 may be configured to receive a binarized representation of various syntax elements, such as the significant_coeff_flag, and coeff_sign_flag, and the coeff_abs_level_remaining syntax element. Entropy decoding unit 70 may decode the coeff_abs_level_remaining[n] syntax element using a binarization having a prefix and an optional suffix using Golomb-Rice/Exponential-Golomb coding in accordance with the techniques of this disclosure. The last interval of the prefix may be decoded using a truncated unary representation according to various examples. Additionally, entropy decoding unit 70 may decode the prefix and the suffix according to a maximum prefix length and suffix length. The maximum prefix length may be based on a bit-depth of a block of video data.

In accordance with the techniques of this disclosure, entropy decoding unit 70 may be configured to: determine a maximum number of bits to be used when decoding an encoded syntax element indicating absolute values of transform coefficients of a coded unit of video data, determine a maximum number of suffix bits to be used when decoding a Golomb-Rice/Exponential-Golomb coding suffix codeword of the syntax element indicating the absolute values of the coefficients, wherein the maximum number of suffix bits is based on the maximum number the maximum number of bits to be used when coding each of the absolute values of the transform coefficients. Entropy decoding unit 70 may be further configured to determine a maximum number of prefix bits to be used when decoding a unary Golomb-Rice/Exponential-Golomb coding prefix codeword of the syntax element indicating absolute values of the coefficients, wherein the maximum number of prefix bits is based on the maximum number of suffix bits, receive from an encoded bitstream the syntax element indicating the absolute values of transform coefficients for the coding unit of video data, decode a prefix codeword for one of absolute values of the coefficients, wherein the prefix codeword has a number of bits that is less than or equal to the maximum number of prefix bits, and decode a suffix codeword for one of the coefficients, wherein the suffix codeword has a number of bits that is less than or equal to the maximum number of suffix bits, wherein the suffix codeword is concatenated to the prefix codeword. Entropy decoding unit 70 may also be further configured to determine an absolute value for the one of the transform coefficients based on the decoded prefix and the decoded suffix, and decode the coding unit based on the determined absolute value of the transform coefficients.

After transforming sample values of a TU, transform processing unit 52 may separate the transformed coefficients into a sign value, and an absolute value of the transform coefficients, Transform processing unit 52 may signal the transformed coefficients to quantization unit 54. Quantization unit 54 may quantize the transform coefficients of a block if the block is not coded using lossless mode, and may signal the quantized or non-quantized transform coefficients to entropy encoding unit 56.

When the video slice is coded as an intra-coded (I) slice, intra prediction unit 74 may generate prediction data for a video block of the current video slice based on a signaled intra prediction mode and data from previously decoded blocks of the current frame or picture. When the video frame is coded as an inter-coded (i.e., B, P or GPB) slice, motion compensation unit 72 produces predictive blocks for a video block of the current video slice based on the motion vectors and other syntax elements received from entropy decoding unit 70. The predictive blocks may be produced from one of the reference pictures within one of the reference picture lists. Video decoder 30 may construct the reference frame lists, List 0 and List 1, using default construction techniques based on reference pictures stored in reference picture memory 82.

Motion compensation unit 72 determines prediction information for a video block of the current video slice by parsing the motion vectors and other syntax elements, and uses the prediction information to produce the predictive blocks for the current video block being decoded. For example, motion compensation unit 72 uses some of the received syntax elements to determine a prediction mode (e.g., intra- or inter-prediction) used to code the video blocks of the video slice, an inter-prediction slice type (e.g., B slice, P slice, or GPB slice), construction information for one or more of the reference picture lists for the slice, motion vectors for each inter-encoded video block of the slice, inter-prediction status for each inter-coded video block of the slice, and other information to decode the video blocks in the current video slice.

Motion compensation unit 72 may also perform interpolation based on interpolation filters. Motion compensation unit 72 may use interpolation filters as used by video encoder 20 during encoding of the video blocks to calculate interpolated values for sub-integer pixels of reference blocks. In this case, motion compensation unit 72 may determine the interpolation filters used by video encoder 20 from the received syntax elements and use the interpolation filters to produce predictive blocks.

Inverse quantization unit 76 inverse quantizes, i.e., de quantizes, the quantized transform coefficients provided in the bitstream and decoded by entropy decoding unit 70. The inverse quantization process may include use of a quantization parameter QPY calculated by video decoder 30 for each video block in the video slice to determine a degree of quantization and, likewise, a degree of inverse quantization that should be applied.

Inverse transform unit 78 applies an inverse transform, e.g., an inverse DCT, an inverse integer transform, or a conceptually similar inverse transform process, to the transform coefficients in order to produce residual blocks in the pixel domain.

After motion compensation unit 72 generates the predictive block for the current video block based on the motion vectors and other syntax elements, video decoder 30 forms a decoded video block by summing the residual blocks from inverse transform unit 78 with the corresponding predictive blocks generated by motion compensation unit 72. Summer 80 represents the component or components that perform this summation operation. If desired, a deblocking filter may also be applied to filter the decoded blocks in order to remove blockiness artifacts. Other loop filters (either in the coding loop or after the coding loop) may also be used to smooth pixel transitions, or otherwise improve the video quality. The decoded video blocks in a given frame or picture are then stored in reference picture memory 82, which stores reference pictures used for subsequent motion compensation. Reference picture memory 82 also stores decoded video for later presentation on a display device, such as display device 32 of FIG. 1.

Figure 4:
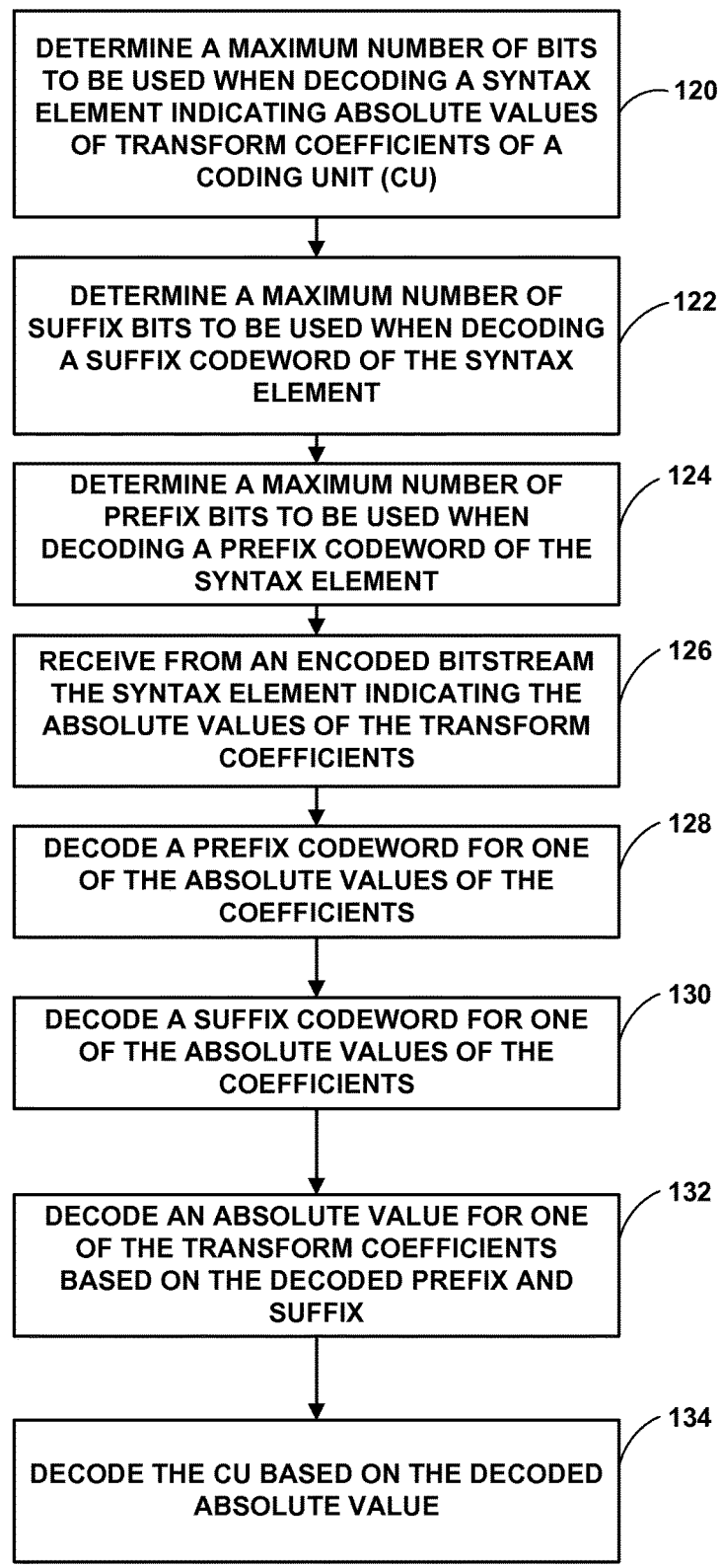
FIG. 4 is a flowchart showing an example binarization decoding method according to the techniques of this disclosure.

FIG. 4 is a flowchart showing an example method according to the techniques of this disclosure. The method of FIG. 4 may be executed by a video decoder (e.g., by video decoder 30 of FIG. 3). Video decoder 30 may be configured to method of coding transform coefficients of a coding unit of video data in a video coding process.

Video decoder 30 may be configured to determine a maximum number of bits to be used when decoding absolute values of transform coefficients of a coded unit of video data (120). Video decoder 30 may further determine a maximum number of suffix bits to be used when decoding a unary Golomb-Rice/Exponential-Golomb coding suffix codeword of the syntax element indicating absolute values of the coefficients (122). The maximum number of suffix bits is based on the maximum number the maximum number of bits to be used when coding each of the absolute values of the transform coefficients Video decoder 30 may further determine a maximum number of prefix bits to be used when decoding a Golomb-Rice/Exponential-Golomb coding prefix codeword of the syntax element indicating the absolute values of the coefficients (124). The maximum number of prefix bits is based on the maximum number of suffix bits. Video decoder 30 receives from an encoded bitstream the syntax element indicating the absolute values of transform coefficients for the coded unit of video data (126).

Video decoder 30 may be further configured to decode a prefix codeword for one of absolute values of the coefficients, wherein the prefix has a number of bits that is less than or equal to the maximum number of prefix bits (128), and decode a suffix codeword for one of the coefficients, wherein the suffix codeword has a number of bits that is less than or equal to the maximum number of suffix bits, wherein the suffix codeword is concatenated to the prefix codeword (130).

Finally, video decoder 30 may determine an absolute value for the one of the transform coefficients based on the decoded prefix and the decoded suffix (132), and decode the coding unit based on the decoded absolute values of the transform coefficients (134).

In various examples, video decoder 30 may be configured to decode the prefix codeword using a truncated unary representation. Also, to decode the prefix codeword and the suffix codeword, video decoder 30 may decode values of a coeff_abs_level_remaining syntax element.

In various examples, to determine the maximum number of prefix bits and the maximum number of suffix bits, video decoder 30 may determine the maximum number of prefix bits and the maximum number of suffix bits based on a bit-depth of samples of the absolute values of the transform coefficients. The maximum number of suffix bits may be equal to a value of a Log2TransformRange variable for a video component of the coding unit, and the value of the Log2TransformRange variable may indicate a maximum number of bits needed to represent the absolute values of the transform coefficients.

Video decoder 30 may be further configured to adjust the maximum number of prefix bits and the maximum number of suffix bits when a coding mode of the coding unit is bypass mode, lossless mode, or skip mode. Video decoder 30 may also be configured to determine that the maximum number of prefix bits and the maximum number of suffix bits are equal when the coding mode is bypass mode. lossless mode, or skip mode.

In some examples, to determine the maximum number of suffix bits, video decoder 30 may determine that the maximum number of suffix bits is equal to a difference between the maximum number of bits to be used when coding the absolute values of the transform coefficients and the maximum number of prefix bits.

A maximum value of the prefix may comprise a maximum truncated unary representation having the maximum number of prefix bits. To determine the maximum number of suffix bits, video decoder 30 may be configured to determine the maximum number of suffix bits is equal to a maximum number of bits needed to represent any of the coefficients. In various examples, video decoder 30 may be further configured to adjust the maximum number of prefix bits and the maximum number of suffix bits based on a coding mode of the coding unit.

Figure 5:
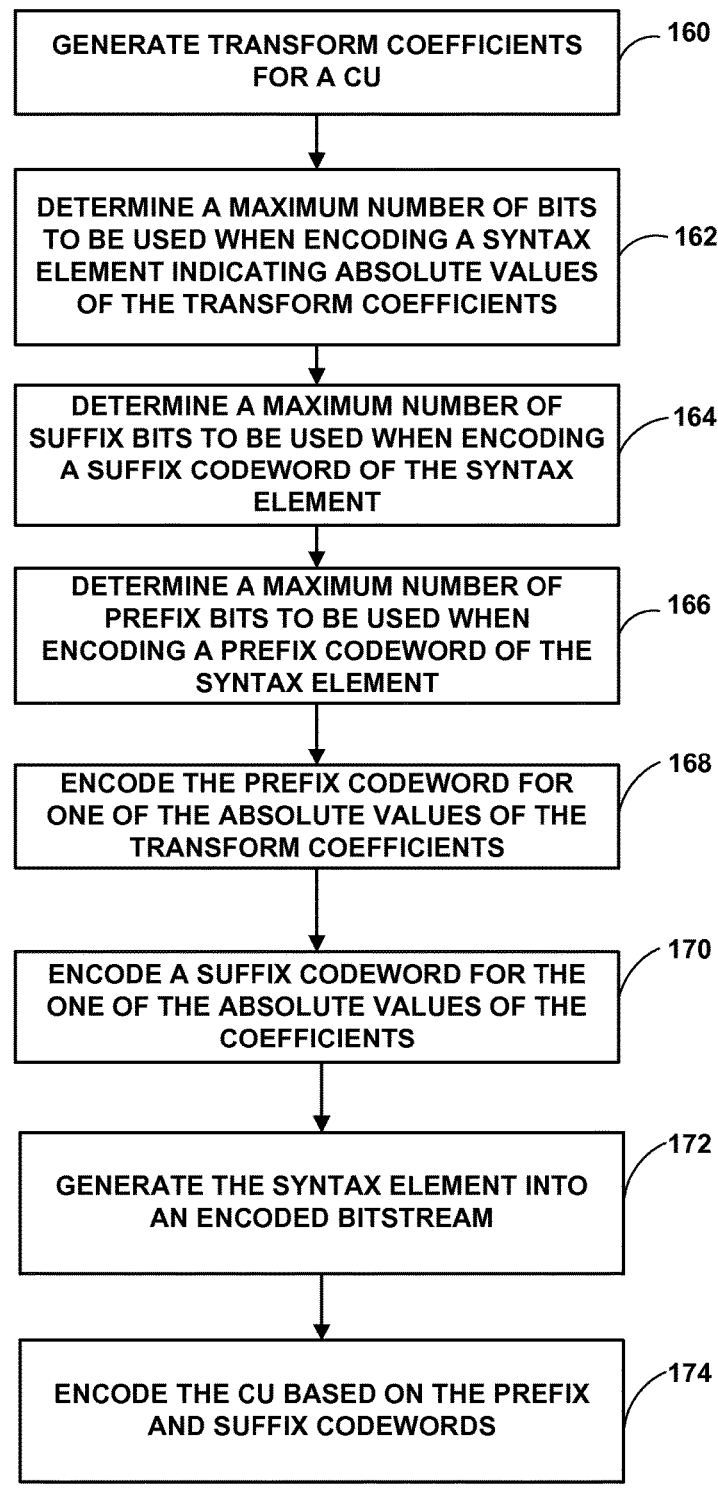
FIG. 5 is a flowchart showing an example binarization encoding method according to the techniques of this disclosure.

FIG. 5 is a flowchart showing an example method according to the techniques of this disclosure. The method of FIG. 5 may be executed by a video encoder (e.g., by video encoder 20 of FIG. 2). Video encoder 20 may be configured to method of coding transform coefficients of a coded unit of video data in a video coding process.

Video encoder 20 may be configured to: generate transform coefficients for a coded unit of video data (160), determine a maximum number of bits to be used when encoding a syntax element indicating absolute values of the transform coefficients of the coded unit of video data (162), determine a maximum number of suffix bits to be used when encoding a unary Golomb-Rice/Exponential-Golomb coding suffix codeword of the syntax element indicating absolute values of the coefficients (164). The maximum number of suffix bits is based on the maximum number of bits to be used when encoding each of the absolute values of the transform coefficients.

Video encoder 20 may also determine a maximum number of prefix bits to be used when encoding a Golomb-Rice/Exponential-Golomb coding prefix codeword of the syntax element indicating the absolute values of the coefficients (166). The maximum number of prefix bits is based on the maximum number of suffix bits.

Video encoder 20 may be further configured to encode a prefix codeword for one of the absolute values of the transform coefficients (168). The prefix codeword has a number of bits that is less than or equal to the maximum number of prefix bits. Video encoder 20 may be further configured to encode a suffix codeword for one of the absolute values of the transform coefficients (170), wherein the suffix codeword has a number of bits that is less than or equal to the maximum number of suffix bits. The suffix codeword is concatenated to the prefix codeword. Video encoder 20 may be further configured to generate the syntax element into an encoded bitstream (172), and encode the coding unit based on the prefix codeword and the suffix codeword (174).

In various examples, the prefix codeword may comprise a truncated unary representation. The maximum number of suffix bits may also be equal to a value of a Log2TransformRange variable for a video component of the coding unit, wherein the value of the Log2TransformRange variable indicates a maximum number of bits needed to represent the absolute values of the transform coefficients in some examples. A maximum value of the prefix may also comprise a maximum truncated unary representation having the maximum number of prefix bits in various examples.

Additionally, to encode the prefix codeword, video encoder 20 may be configured to encode values of a coeff_abs_level_remaining syntax element. To determine the maximum number of prefix bits and the maximum number of suffix bits video encoder 20 may be configured to determine the maximum number of prefix bits and the maximum number of suffix bits based on a bit-depth of samples of the absolute values of the transform coefficients.

In some examples, video encoder 20 may be further configured to adjust the maximum number of prefix bits and the maximum number of suffix bits when a coding mode of the coding unit is bypass mode, lossless mode, or skip mode. Video encoder 20 may also be further configured to determine that the maximum number of prefix bits and the maximum number of suffix bits are equal when the coding mode is bypass mode, lossless mode, or skip mode.

To determine the maximum number of suffix bits, video encoder 20 may be configured to determine that the maximum number of suffix bits is equal to a difference between the maximum number of bits to be used when coding the absolute values of the transform coefficients and the maximum number of prefix bits.

In some examples, to determine the maximum number of suffix bits, video encoder 20 may be configured to determine the maximum number of suffix bits is equal to a maximum number of bits needed to represent any of the coefficients. Video encoder 20 may also be further configured to adjust the maximum number of prefix bits and the maximum number of suffix bits based on a coding mode of the coding unit in some examples.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc. digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs). or other equivalent integrated or discrete logic circuitry. Accordingly. the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of decoding video data, the method comprising:

receiving, from an encoded bitstream, a first syntax element indicating a range of values based on a bit-depth, wherein the range of values is used to represent absolute values of transform coefficients of a coding unit of the video data, wherein the range of values includes a minimum value and a maximum value, wherein the bit-depth represents a number of bits used to represent luma or chroma video components of the coding unit of the video data, and wherein the coding unit of the video data is a region of the video data;

receiving, from the encoded bitstream, a second syntax element indicating an absolute value of a first transform coefficient of the transform coefficients of the coding unit of the video data, wherein the second syntax element is represented by a prefix codeword and a suffix codeword concatenated to the prefix codeword;

determining a maximum number of suffix bits to be used when decoding the suffix codeword of the second syntax element, wherein the maximum number of suffix bits is based on the maximum value of the range indicated by the first syntax element that is based on the bit-depth representing the number of bits used to represent luma or chroma video components of the coding unit of the video data;

determining a maximum number of prefix bits to be used when decoding the prefix codeword of the second syntax element, wherein the maximum number of prefix bits is based on a difference between the determined maximum number of suffix bits and a value representative of a maximum number of bits used to represent the transform coefficients of the coding unit of the video data;

decoding the prefix codeword of the second syntax element based on the determined maximum number of prefix bits, wherein the prefix codeword has a number of bits that is less than or equal to the determined maximum number of prefix bits;

decoding the suffix codeword of the second syntax element based on the determined maximum number of suffix bits, wherein the suffix codeword has a number of bits that is less than or equal to the determined maximum number of suffix bits;

determining the absolute value of the first transform coefficient based on the decoded prefix codeword and the decoded suffix codeword; and decoding the coding unit based on the determined absolute value of the first transform coefficient.

2. The method of claim 1, wherein the prefix codeword comprises a truncated unary representation.

3. The method of claim 1, wherein the second syntax element is coeff_abs_level_remaining.

4. The method of claim 1, wherein the maximum number of suffix bits is equal to a value of a Log2TransformRange variable for a video component of the coding unit, wherein the value of the Log2TransformRange variable indicates a maximum number of bits needed to represent the absolute values of the transform coefficients.

5. The method of claim 1, further comprising adjusting the maximum number of prefix bits and the maximum number of suffix bits when a coding mode of the coding unit is bypass mode, lossless mode, or skip mode.

6. The method of claim 5, further comprising determining that the maximum number of prefix bits and the maximum number of suffix bits are equal when the coding mode is bypass mode, lossless mode, or skip mode.

7. The method of claim 1, wherein a maximum value of the prefix comprises a maximum truncated unary representation having the maximum number of prefix bits.

8. The method of claim 1, further comprising adjusting the maximum number of prefix bits and the maximum number of suffix bits based on a coding mode of the coding unit.

9. The method of claim 1, wherein the first syntax element is Log2TransformRange and the second syntax element is coeff_abs_level_remaining.

10. A method of encoding video data, the method comprising:

generating transform coefficients for a coding unit of the video data, wherein the coding unit of the video data is a region of the video data;

generating a first syntax element indicating a range of values based on a bit-depth, wherein the range of values is used to represent absolute values of the transform coefficients of the coding unit of the video data, wherein the range of values includes a minimum value and a maximum value, and wherein the bit-depth represents a number of bits used to represent luma or chroma video components of the coding unit of the video data;

generating a second syntax element indicating an absolute value of a first transform coefficient of the transform coefficients of the coding unit of the video data;

determining a maximum number of suffix bits to be used when encoding a suffix codeword corresponding to the second syntax element, wherein the maximum number of suffix bits is based on the maximum value of the range indicated by the first syntax element that is based on the bit-depth representing the number of bits used to represent luma or chroma video components of the coding unit of the video data;

determining a maximum number of prefix bits to be used when encoding a prefix codeword corresponding to the second syntax element, wherein the maximum number of prefix bits is based on a difference between the determined maximum number of suffix bits and a value representative of a maximum number of bits used to represent the transform coefficients of the coding unit of the video data;

encoding the prefix codeword corresponding to the second syntax element based on the determined maximum number of prefix bits, wherein the prefix codeword has a number of bits that is less than or equal to the determined maximum number of prefix bits;

encoding the suffix codeword corresponding to the second syntax element based on the determined maximum number of suffix bits, wherein the suffix codeword has a number of bits that is less than or equal to the determined maximum number of suffix bits, and wherein the suffix codeword is concatenated to the prefix codeword; and generating an encoded bitstream including the prefix codeword and the suffix codeword that together represent the second syntax element.

11. The method of claim 10, wherein the prefix codeword comprises a truncated unary representation.

12. The method of claim 10, wherein the second syntax element is coeff_abs_level_remaining.

13. The method of claim 10, wherein the maximum number of suffix bits is equal to a value of a Log2TransformRange variable for a video component of the coding unit, wherein the value of the Log2TransformRange variable indicates a maximum number of bits needed to represent the absolute values of the transform coefficients.

14. The method of claim 10, further comprising adjusting the maximum number of prefix bits and the maximum number of suffix bits when a coding mode of the coding unit is bypass mode, lossless mode, or skip mode.

15. The method of claim 14, further comprising determining that the maximum number of prefix bits and the maximum number of suffix bits are equal when the coding mode is bypass mode, lossless mode, or skip mode.

16. The method of claim 10, wherein a maximum value of the prefix comprises a maximum truncated unary representation having the maximum number of prefix bits.

17. The method of claim 10, further comprising adjusting the maximum number of prefix bits and the maximum number of suffix bits based on a coding mode of the coding unit.

18. The method of claim 10, wherein the first syntax element is Log2TransformRange and the second syntax element is coeff_abs_level_remaining.

19. A device for decoding video data comprising:

a memory configured to store video data; and at least one processor configured to:

receive, from an encoded bitstream, a first syntax element indicating a range of values based on a bit-depth, wherein the range of values is used to represent absolute values of transform coefficients of a coding unit of the video data, wherein the range of values includes a minimum value and a maximum value, wherein the bit-depth represents a number of bits used to represent luma or chroma video components of the coding unit of the video data, and wherein the coding unit of the video data is a region of the video data;

receive, from the encoded bitstream, a second syntax element indicating an absolute value of a first transform coefficient of the transform coefficients of the coding unit of the video data, wherein the second syntax element is represented by a prefix codeword and a suffix codeword concatenated to the prefix codeword;

determine a maximum number of suffix bits to be used when decoding the suffix codeword of the second syntax element, wherein the maximum number of suffix bits is based on the maximum value of the range indicated by the first syntax element that is based on the bit-depth representing the number of bits used to represent luma or chroma video components of the coding unit of the video data;

determine a maximum number of prefix bits to be used when decoding the prefix codeword of the second syntax element, wherein the maximum number of prefix bits is based on a difference between the determined maximum number of suffix bits and a value representative of a maximum number of bits used to represent the transform coefficients of the coding unit of the video data;

decode the prefix codeword of the second syntax element based on the determined maximum number of prefix bits, wherein the prefix codeword has a number of bits that is less than or equal to the determined maximum number of prefix bits;

decode the suffix codeword of the second syntax element based on the determined maximum number of suffix bits, wherein the suffix codeword has a number of bits that is less than or equal to the determined maximum number of suffix bits;

determine the absolute value of the first transform coefficient based on the decoded prefix codeword and the decoded suffix codeword; and decode the coding unit based on the determined absolute value of the first transform coefficient.

20. The device of claim 19, wherein the at least one processor is further configured to adjust the maximum number of prefix bits and the maximum number of suffix bits when a coding mode of the coding unit is bypass mode, lossless mode, or skip mode.

21. The device of claim 19, wherein the prefix codeword comprises a truncated unary representation.

22. The device of claim 19, wherein the second syntax element is coeff_abs_level_remaining.

23. The device of claim 19, wherein the first syntax element is Log2TransformRange and the second syntax element is coeff_abs_level_remaining.

* * * * *